US012812958B2

(12) United States Patent
Lee et al.

(10) Patent No.: US 12,812,958 B2
(45) Date of Patent: Nov. 24, 2026

(54) SEMICONDUCTOR DEVICE AND METHOD OF FORMING THE SAME

(71) Applicant: Taiwan Semiconductor Manufacturing Co., Ltd., Hsinchu (TW)

(72) Inventors: Hsin-Hua Lee, Taoyuan City (TW); Da-Yuan Lee, Jhubei City (TW); Kuei-Lun Lin, Keelung City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 449 days.

(21) Appl. No.: 17/713,014

(22) Filed: Apr. 4, 2022

(65) Prior Publication Data

US 2023/0163191 A1 May 25, 2023

Related U.S. Application Data

(60) Provisional application No. 63/264,391, filed on Nov. 22, 2021.

(51) Int. Cl.
*H10D 64/68* (2025.01)
*H10D 30/67* (2025.01)
(Continued)

(52) U.S. Cl.
CPC ........... *H10D 64/691* (2025.01); *H10D 64/01* (2025.01); *H10D 64/681* (2025.01); *H10P 14/6339* (2026.01); *H10P 14/668* (2026.01); *H10D 30/6735* (2025.01); *H10D 30/6757* (2025.01); *H10D 62/118* (2025.01)

(58) Field of Classification Search
CPC ................. H01L 29/513; H01L 29/517; H01L 29/42392; H01L 29/66439; H01L 29/775; H01L 29/78696
See application file for complete search history.

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

CN 106935650 A 7/2017
CN 113053882 A 6/2021
(Continued)

*Primary Examiner* — Steven B Gauthier
*Assistant Examiner* — E. Rhett Cheek
(74) *Attorney, Agent, or Firm* — Slater Matsil, LLP

(57) ABSTRACT

A semiconductor device is provided in accordance with some embodiments. The semiconductor device includes an interfacial layer disposed over a channel region, a gate dielectric structure disposed over the channel region, and a gate electrode disposed over the gate dielectric structure. The gate dielectric structure includes a first layer of an oxide of a first metal disposed over the interfacial layer and a second layer of an oxide or silicate of a second metal disposed over the first layer. The first layer has a first thickness, and the second layer has a second thickness that is at least three times greater than the first thickness. An oxygen areal density of the oxide of the first metal is greater than an oxygen areal density of the oxide of the second metal.

20 Claims, 50 Drawing Sheets

(51) Int. Cl.

| | |
|---|---|
| ***H10D 62/10*** | (2025.01) |
| ***H10D 64/01*** | (2025.01) |
| ***H10P 14/60*** | (2026.01) |

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 12,396,217 | B2 * | 8/2025 | Dorow | H10D 30/6757 |
| 12,471,354 | B2 * | 11/2025 | Chao | H10D 84/0144 |
| 2002/0182831 | A1 | 12/2002 | Tsuchiaki | |
| 2007/0057335 | A1 | 3/2007 | Tsuchiya et al. | |
| 2010/0279515 | A1 * | 11/2010 | Yu | H01L 21/02052 438/758 |
| 2013/0021840 | A1 * | 1/2013 | Tokita | G11C 11/419 257/329 |
| 2015/0104933 | A1 | 4/2015 | Tsai et al. | |
| 2015/0140834 | A1 * | 5/2015 | Kashefi | H01L 21/0228 438/771 |
| 2016/0071953 | A1 * | 3/2016 | Mountsier | H01L 21/31144 438/586 |
| 2017/0236702 | A1 * | 8/2017 | Swenberg | H01L 21/02274 438/784 |
| 2017/0278743 | A1 * | 9/2017 | Tsai | H01L 21/76895 |
| 2018/0277448 | A1 * | 9/2018 | Chen | H01L 29/517 |
| 2019/0109204 | A1 * | 4/2019 | Cheng | H01L 27/0922 |
| 2020/0105532 | A1 * | 4/2020 | Liao | H10D 84/038 |
| 2020/0105672 | A1 * | 4/2020 | Madhavan | H01L 21/02167 |
| 2020/0119155 | A1 * | 4/2020 | Cheng | H10D 84/853 |
| 2020/0243685 | A1 * | 7/2020 | Yamazaki | H01L 21/02274 |
| 2020/0373300 | A1 * | 11/2020 | Zhang | H10D 30/43 |
| 2020/0381311 | A1 * | 12/2020 | Kim | H10D 64/017 |
| 2020/0395455 | A1 * | 12/2020 | Kim | H10D 64/513 |

FOREIGN PATENT DOCUMENTS

| | | | |
|---|---|---|---|
| CN | 113540082 | A | 10/2021 |
| TW | 201338046 | A | 9/2013 |
| TW | 201341298 | A | 10/2013 |

* cited by examiner

SEMICONDUCTOR DEVICE AND METHOD OF FORMING THE SAME

PRIORITY CLAIM AND CROSS-REFERENCE

This application claims the benefit of U.S. Provisional Application No. 63/264,391, filed on Nov. 22, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
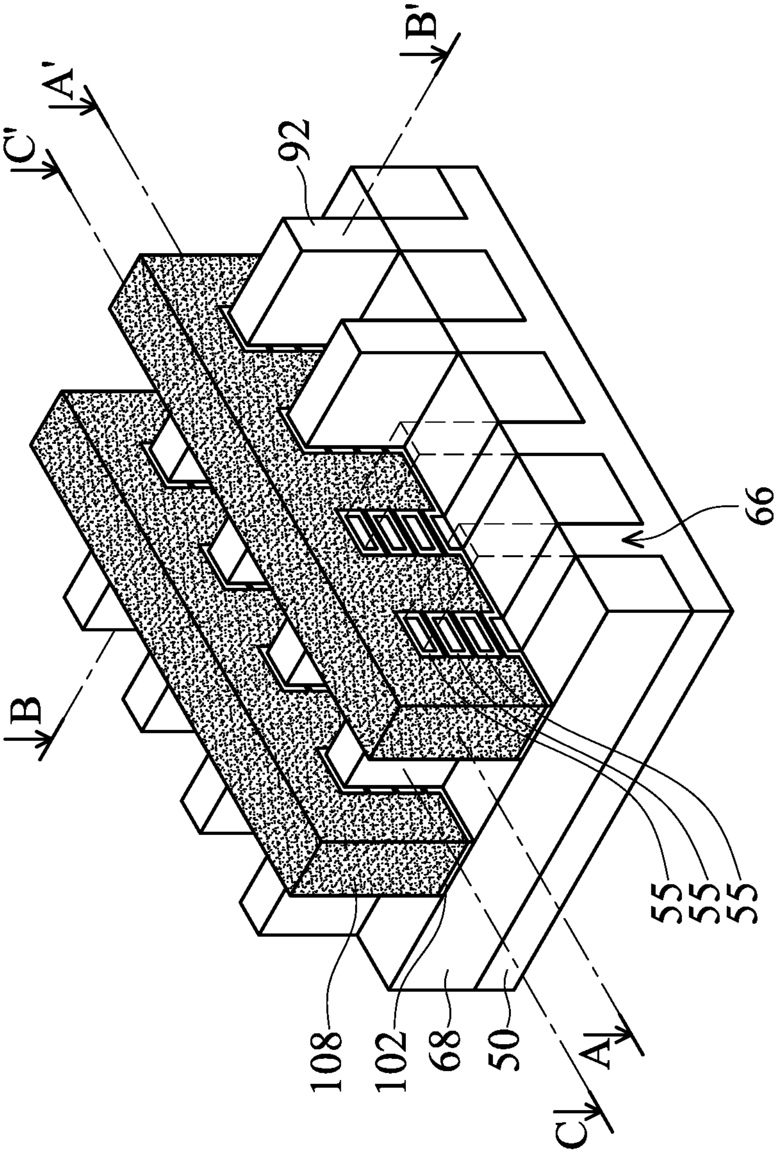
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As discussed in greater detail below, embodiments illustrated in the present disclosure provide a semiconductor device comprising gate dielectric structure and methods for forming it. The gate dielectric structure may include a relatively thin first dielectric layer that may create dipoles in the gate dielectric structure for tuning the threshold voltage (Vt) of a semiconductor device. The gate dielectric structure may also include a second dielectric layer disposed over the first dielectric layer. In some embodiments, the second dielectric layer has high-k characteristics and is relatively thick, so that the gate dielectric structure may have high-k characteristics similar to that of the second dielectric layer.

Embodiments are described below in a particular context, a die comprising nanostructure-FETs. Various embodiments may be applied, however, to dies comprising other types of transistors (e.g., fin field-effect transistors (FinFETs), planar transistors, or the like) in lieu of or in combination with the nanostructure-FETs.

FIG. 1 illustrates an example of nanostructure-FETs (e.g., nanowire FETs, nanosheet FETs, gate all around FETs, multi bridge channel FETs, nanoribbon FETs, or the like) in a three-dimensional view, in accordance with some embodiments. The nanostructure-FETs comprise nanostructures 55 (e.g., nanosheets, nanowire, or the like) over fins 66 on a substrate 50 (e.g., a semiconductor substrate), wherein the nanostructures 55 act as channel regions for the nanostructure-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term “substrate” may refer to the semiconductor substrate alone or a combination of the semiconductor substrate and the isolation regions. Additionally, although a bottom portion of the fins 66 is illustrated as being single, continuous materials with the substrate 50, the bottom portion of the fins 66 and/or the substrate 50 may comprise a single material or a plurality of materials. In this context, fins 66 refer to the portion extending between the neighboring STI regions 68.

Gate dielectric structures 102 are disposed over top surfaces of the fins 66 and along top surfaces, sidewalls, and bottom surfaces of the nanostructures 55. Gate electrodes 108 are over the gate dielectric structures 102. Epitaxial source/drain regions 92 are disposed over the fins 66 on opposing sides of the gate dielectric structures 102 and the gate electrodes 108.

FIG. 1 further illustrates reference cross-sections that are used in later figures. Cross-section A-A' is along a longitudinal axis of a gate electrode 108 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-structure-FETs. Subsequent figures refer to these reference cross-sections for clarity.

Some embodiments discussed herein are discussed in the context of nanostructure-FETs formed using a gate-last process. In other embodiments, a gate-first process may be used. Also, some embodiments contemplate aspects used in planar devices, such as planar FETs or in fin field-effect transistors (FinFETs).

FIGS. 2 through 24C are cross-sectional views of intermediate stages in the manufacturing of nanostructure-FETs, in accordance with some embodiments. FIGS. 2 through 5, 6A, 13A, 14A, 15A, 16A, 17A, 18A, 19A, 20A, 21A, 22A, 23A, and 24A illustrate reference cross-section A-A' illustrated in FIG. 1. FIGS. 6B, 7B, 8B, 9B, 10B, 11B, 11C, 12B, 12D, 13B, 14B, 15B, 16B, 17B, 18B, 19B, 20B, 21B, 22B, 23B, and 24B illustrate reference cross-section B-B' illustrated in FIG. 1. FIGS. 7A, 8A, 9A, 10A, 11A, 12A, 12C, 13C, 21C, 22C, 23C, and 24C illustrate reference cross-section C-C' illustrated in FIG. 1.

Figure 2:
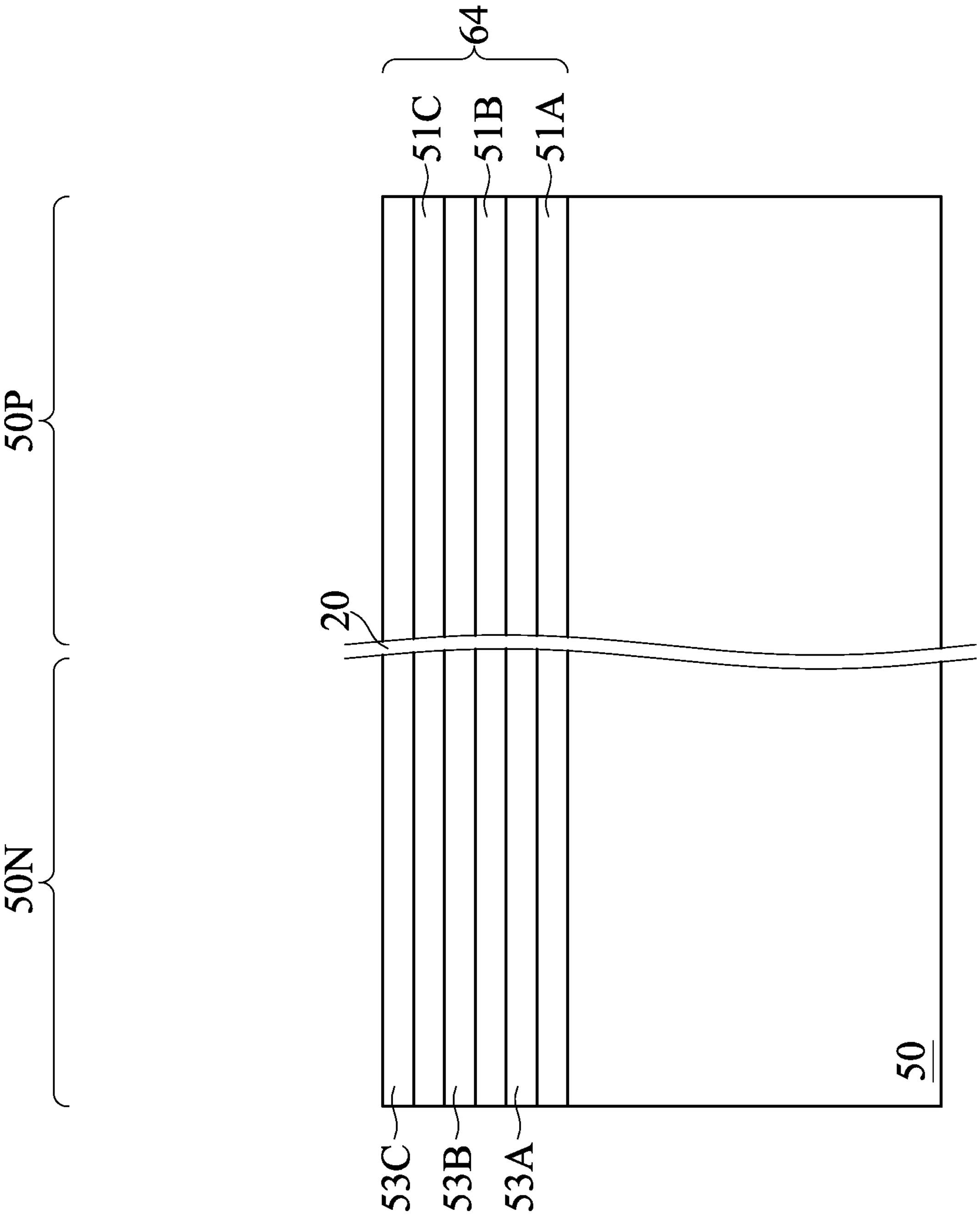
FIGS. 2, 3, 4, 5, 6A, 6B, 7A, 7B 8A, 8B, 9A, 9B, 10A, 10B, 11A, 11B, 11C, 12A, 12B, 12C, 12D, 13A, 13B, 13C, 14A, 14B, 15A, 15B, 16A, 16B, 17A, 17B, 18A, 18B, 19A, 19B, 20A, 20B, 21A, 21B, 21C, 22A, 22B, 22C, 23A, 23B, and 23C are cross-sectional views of intermediate stages in the manufacturing of nanostructure-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nanostructure-FETs, and the p-type region 50P can be for forming p-type devices, such as PMOS transistors, e.g., p-type nano-structure-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed, and the first semiconductor layers 51 will be patterned to form channel regions of nanostructure-FETs in the p-type region 50P. Also, the first semiconductor layers 51 will be removed, and the second semiconductor layers 53 will be patterned to form channel regions of nanostructure-FETs in the n-type regions 50N. Nevertheless, in some embodiments the first semiconductor layers 51 may be removed and the second semiconductor layers 53 may be patterned to form channel regions of nanostructure-FETs in the p-type region 50P, and the second semiconductor layers 53 may be removed, and the first semiconductor layers 51 may be patterned to form channel regions of nanostructure-FETs in the n-type regions 50N.

Figure 24A:
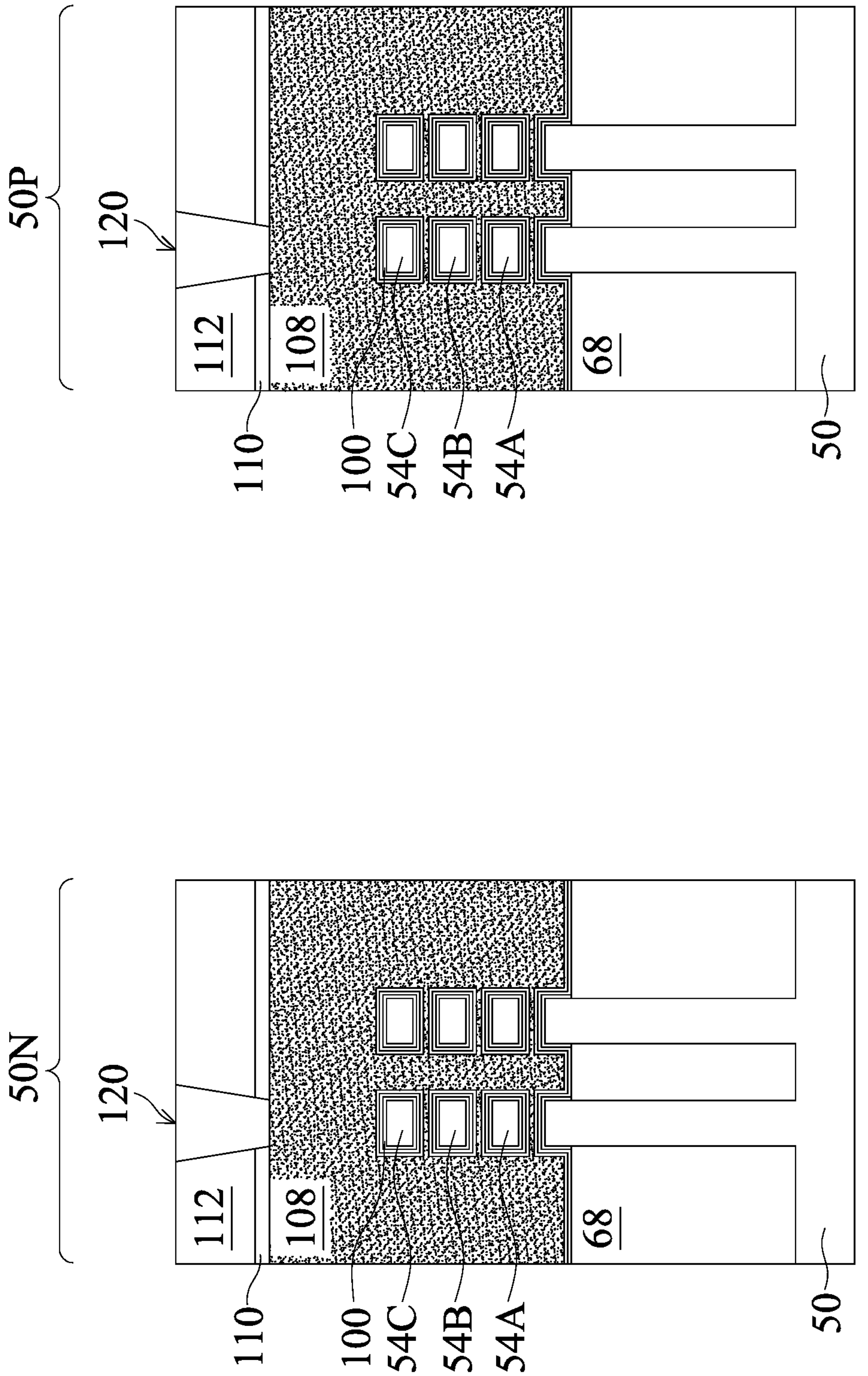
FIGS. 24A, 24B, and 24C are cross-sectional views of a nano-FET, in accordance with some embodiments.
Figure 24B:
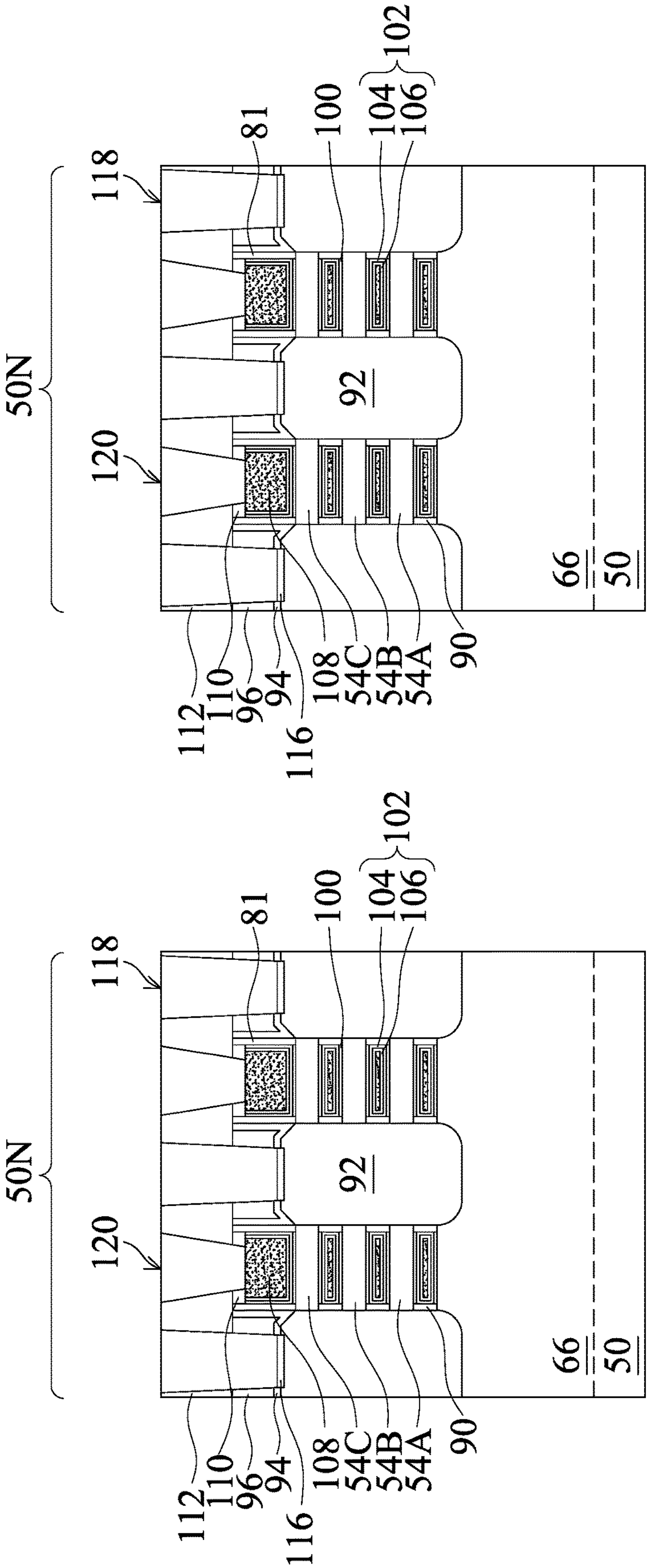
Figure 24C:
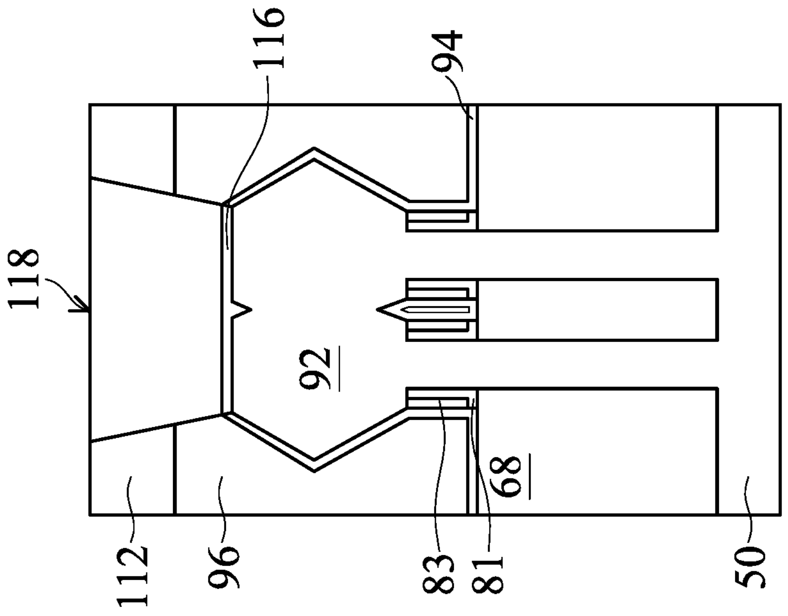

In still other embodiments, the first semiconductor layers 51 may be removed, and the second semiconductor layers 53 may be patterned to form channel regions of nanostructure-FETs in both the n-type region 50N and the p-type region 50P. In other embodiments, the second semiconductor layers 53 may be removed, and the first semiconductor layers 51 may be patterned to form channel regions of nanostructure-FETs in both the n-type region 50N and the p-type region 50P. In such embodiments, the channel regions in both the n-type region 50N and the p-type region 50P may have a same material composition (e.g., silicon, or the another semiconductor material) and be formed simultaneously. FIGS. 24A, 24B, and 24C illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nanostructure-FETs, such as silicon germanium or the like, and the second semiconductor layers 53 may be formed of a second semiconductor material suitable for n-type nano-structure-FETs, such as silicon, silicon carbon, or the like. The multi-layer stack 64 is illustrated as having a bottom-most semiconductor layer suitable for p-type nanostructure-FETs for illustrative purposes. In some embodiments, multi-layer stack 64 may be formed such that the bottommost layer is a semiconductor layer suitable for n-type nanostructure-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type NSFETS. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type NSFETS.

Figure 3:
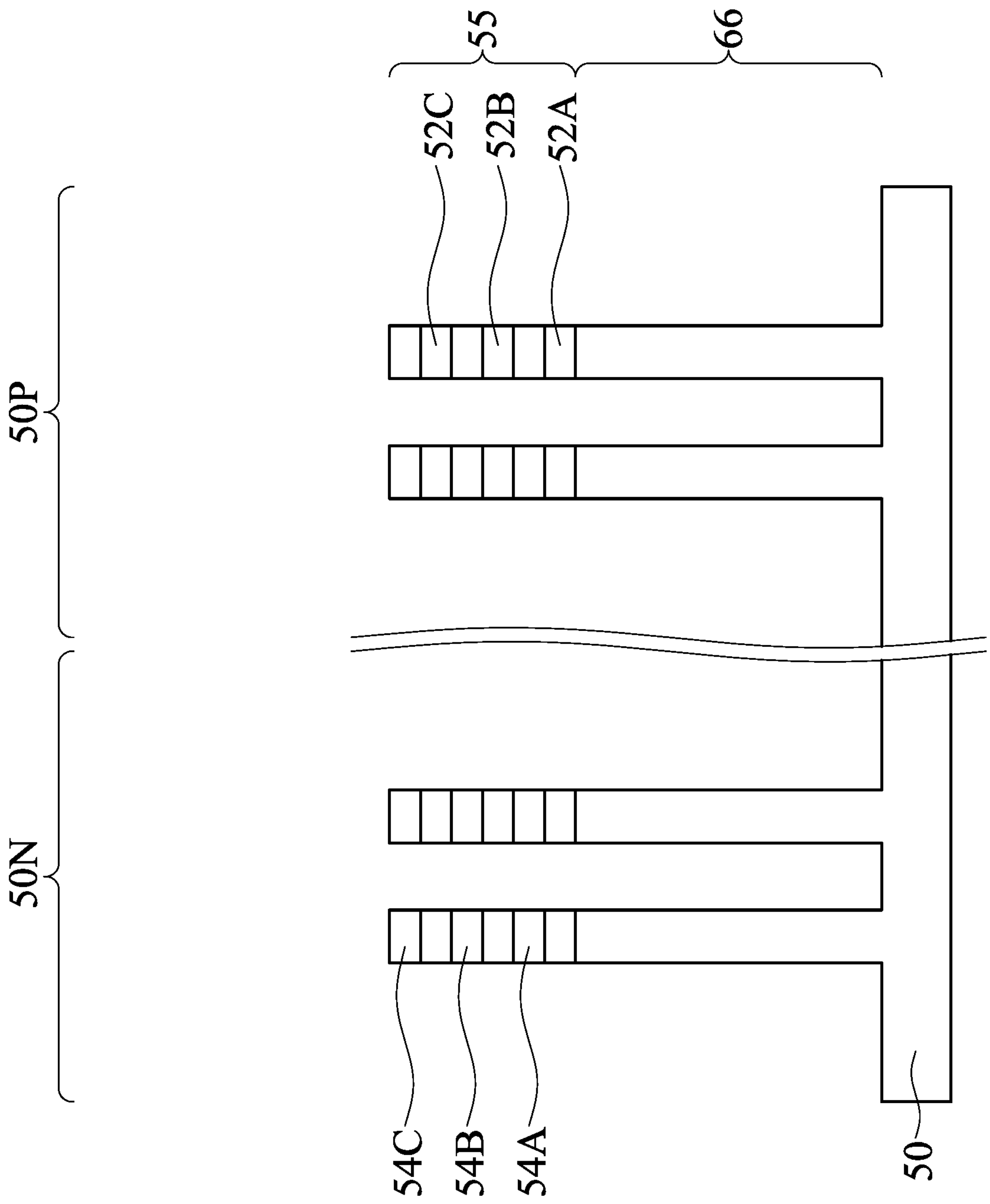

Referring now to FIG. 3, fins 66 are formed in the substrate 50, and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66. In other embodiments, the channel regions in the n-type region 50N and the p-type region 50P may be formed simultaneously and have a same material composition, such as silicon, silicon germanium, or another semiconductor material. FIGS. 24A, 24B, and 24C illustrate a structure resulting from such embodiments where the channel regions in both the p-type region 50P and the n-type region 50N comprise silicon, for example.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
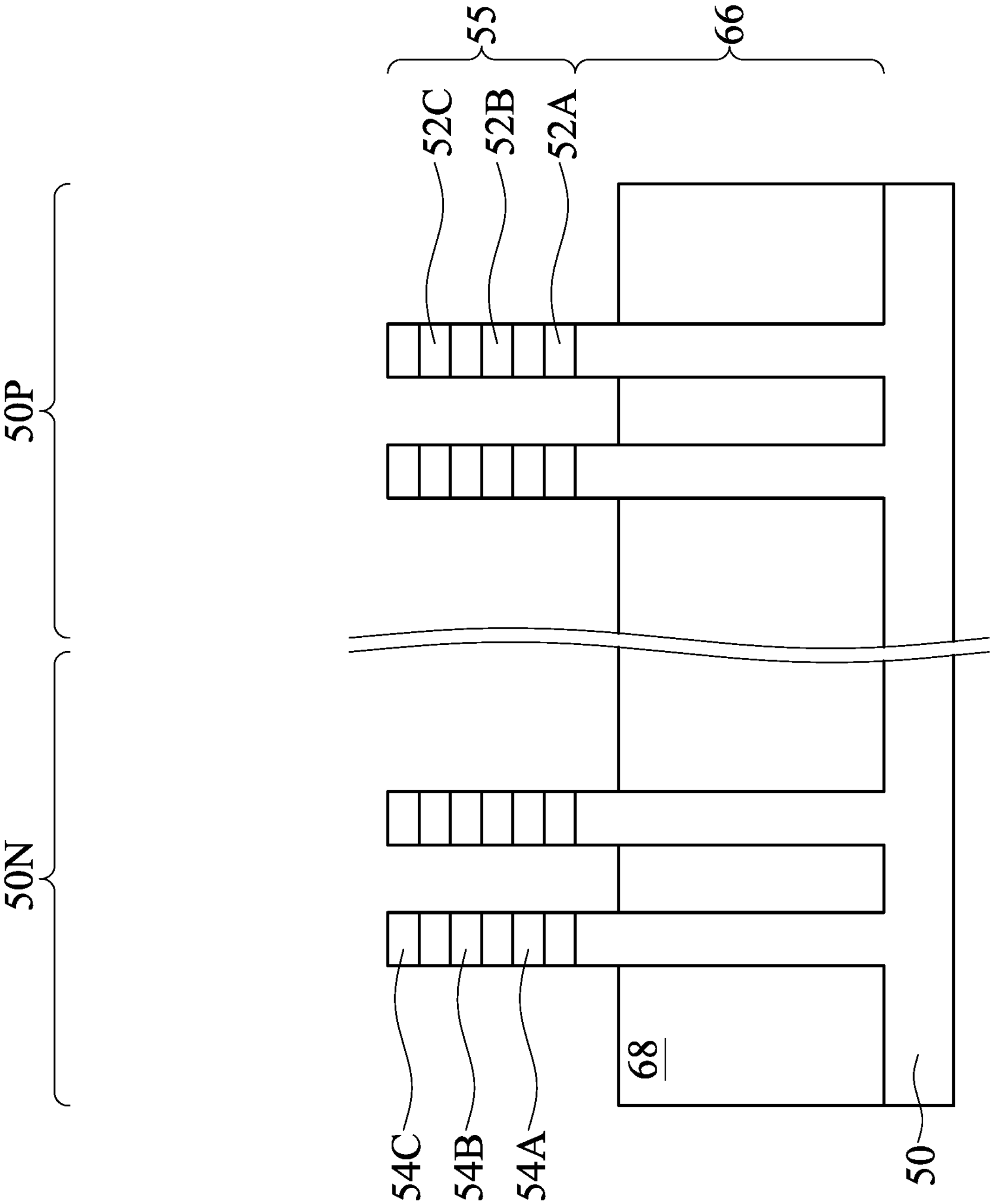

In FIG. 4, the STI regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments, a liner (not separately illustrated) may first be formed along a surface of the substrate 50, the fins 66, and the nanostructures 55. Thereafter, a fill material, such as those discussed above, may be formed over the liner.

A removal process is then applied to the insulation material to remove excess insulation material over the nanostructures 55. In some embodiments, a planarization process such as a chemical mechanical polish (CMP) process, an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type regions 50N and the p-type regions 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments, one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/$cm^3$ to about $10^{14}$ atoms/$cm^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/$cm^3$ to about $10^{14}$ atoms/$cm^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
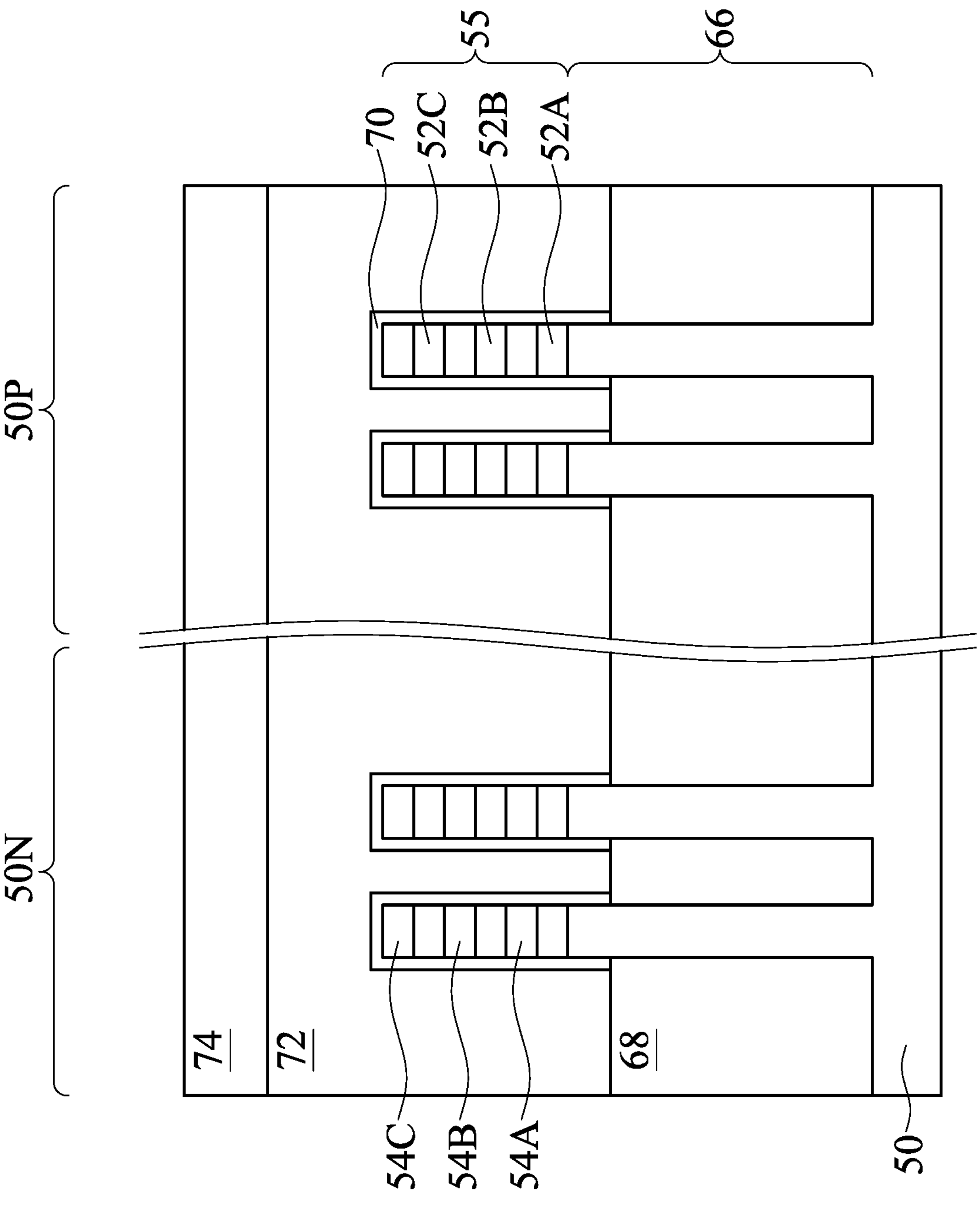

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
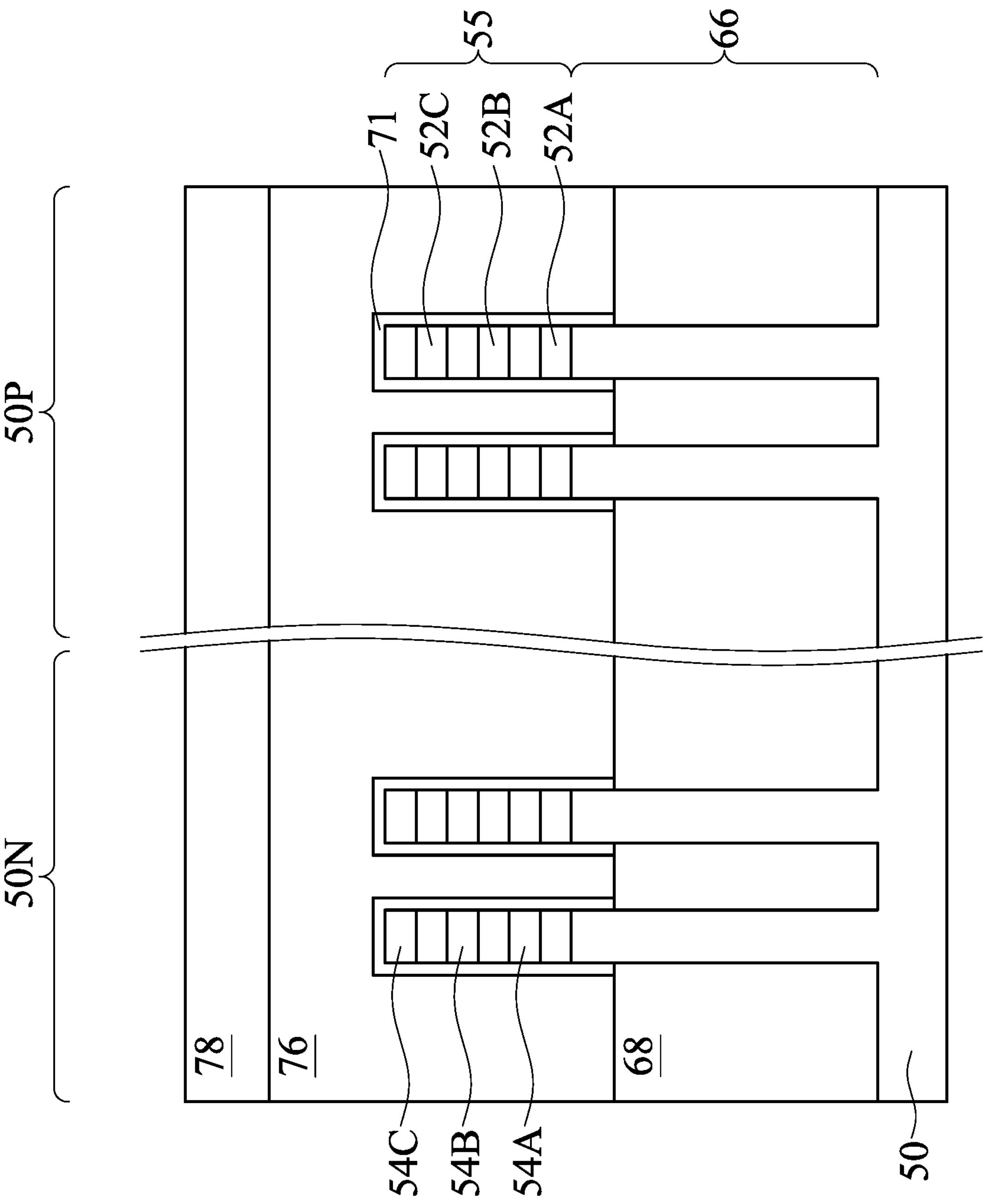
Figure 6B:
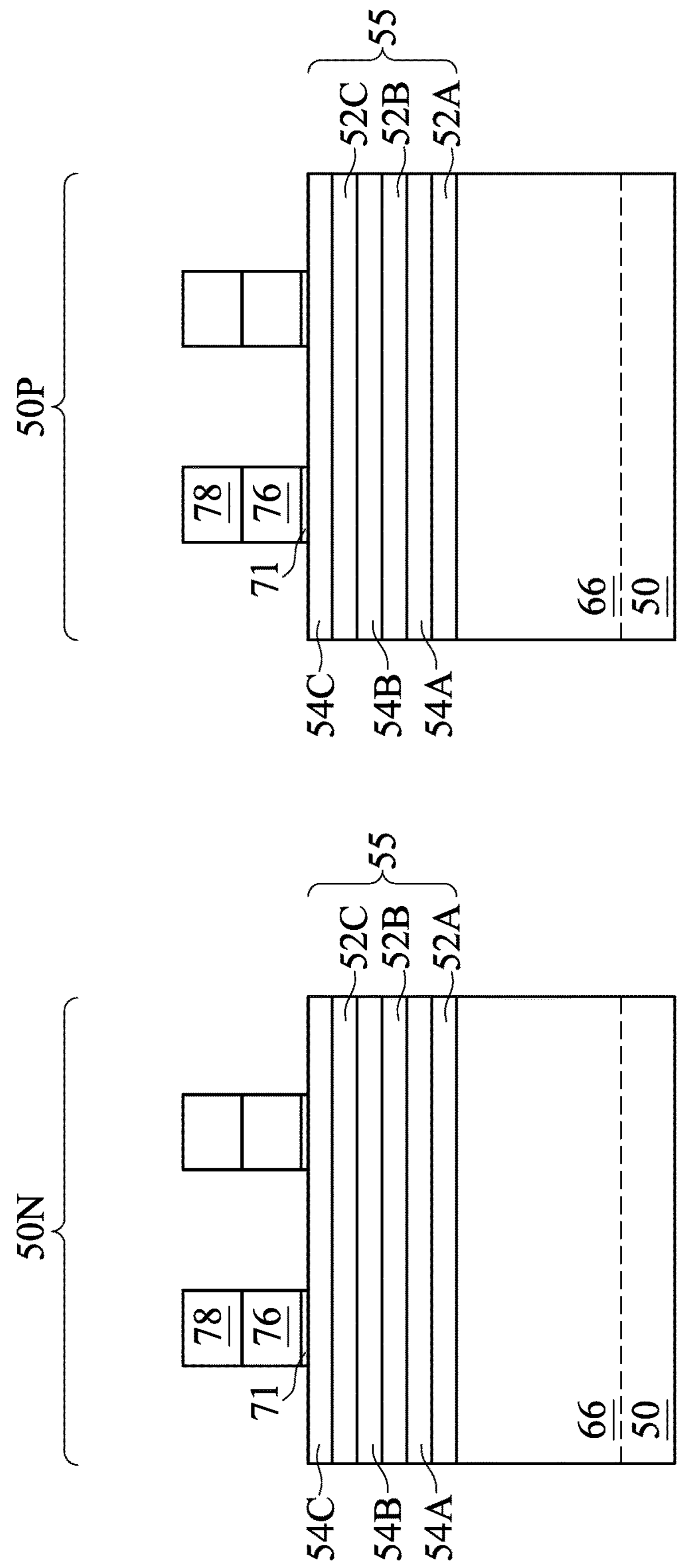

FIGS. 6A through 21C illustrate various additional steps in the manufacturing of embodiment devices. FIGS. 6A, 7A, 8A, 9A, 10A, 11A, 12A, 12C, 13A, 13C, 14A, 15A, and 21C illustrate features in either the n-type regions 50N or the p-type regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
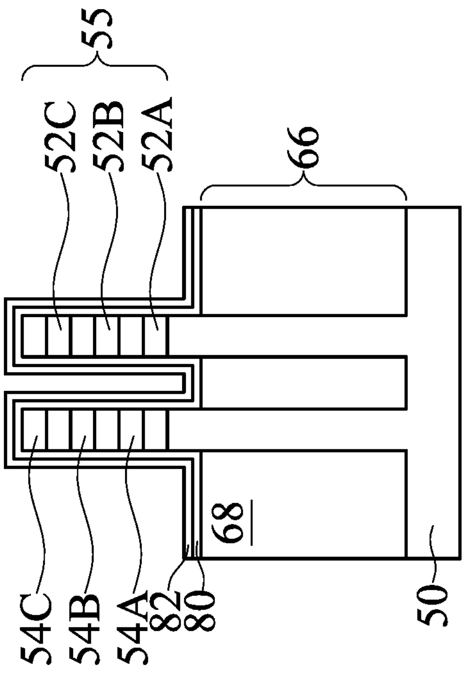
Figure 7B:
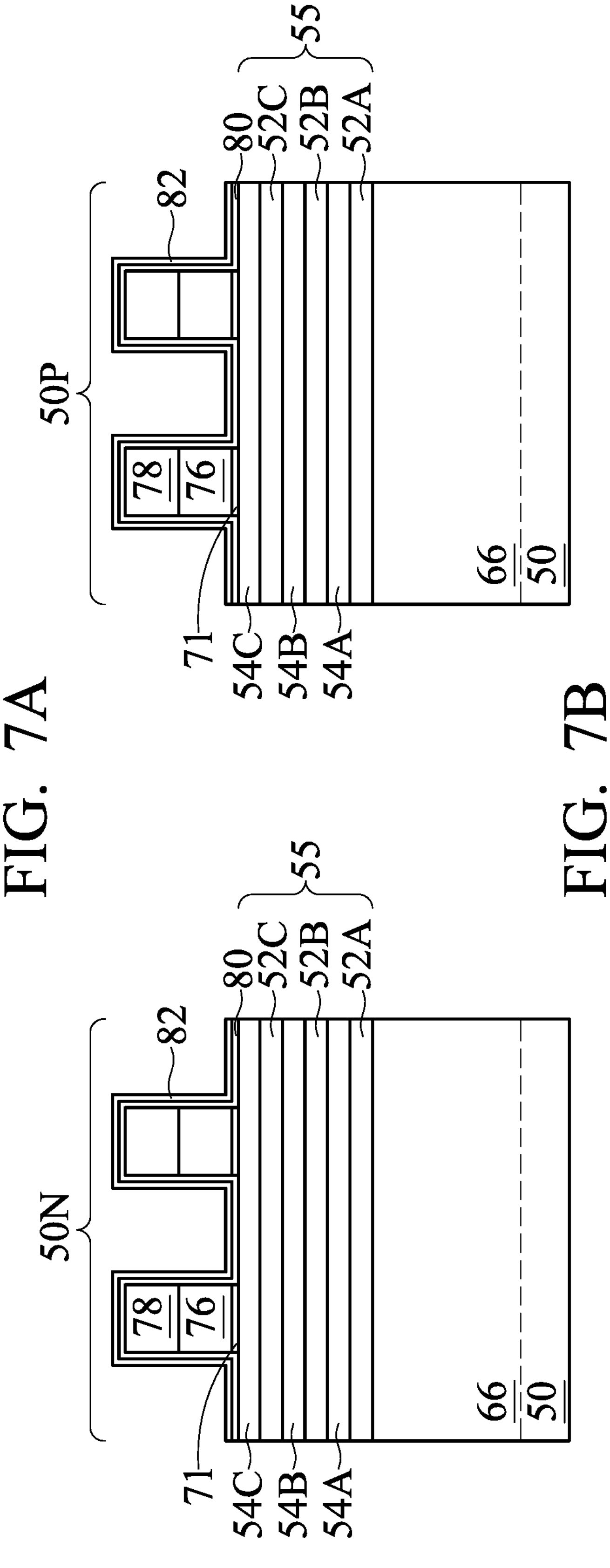

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be any of the n-type impurities previously discussed, and the p-type impurities may be any of the p-type impurities previously discussed. The lightly doped source/drain regions may have a concentration of impurities in a range from about $1\times10^{15}$ atoms/$cm^3$ to about $1\times10^{19}$ atoms/$cm^3$. An anneal may be used to repair implant damage and to activate the implanted impurities.

Figure 8A:
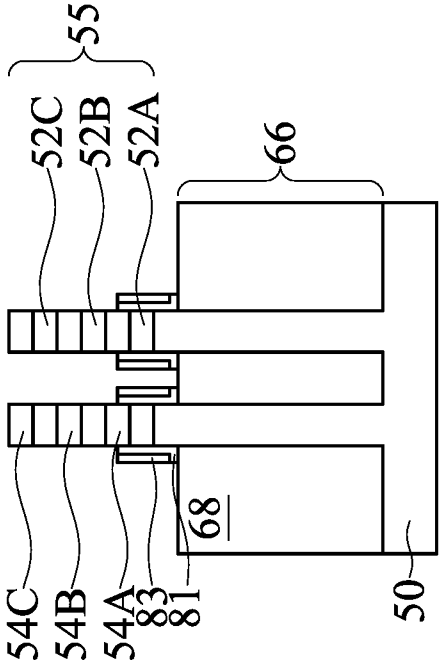
Figure 8B:
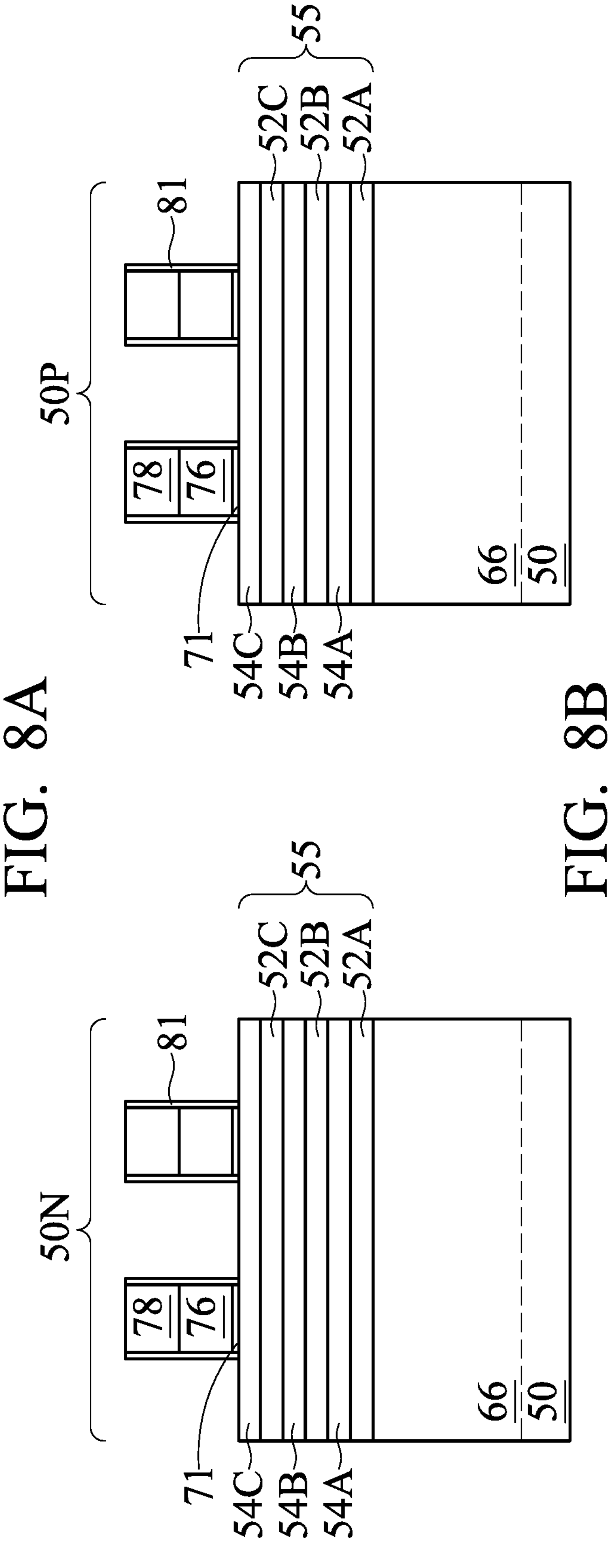

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source/drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81, as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, a different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
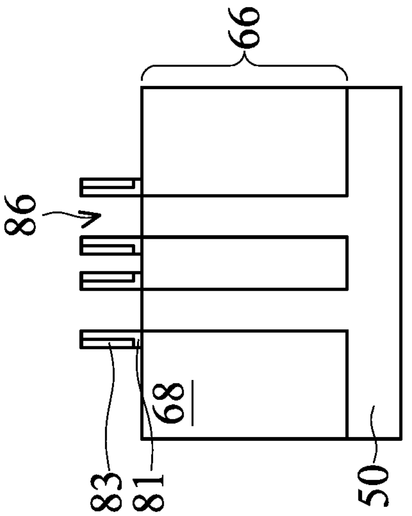
Figure 9B:
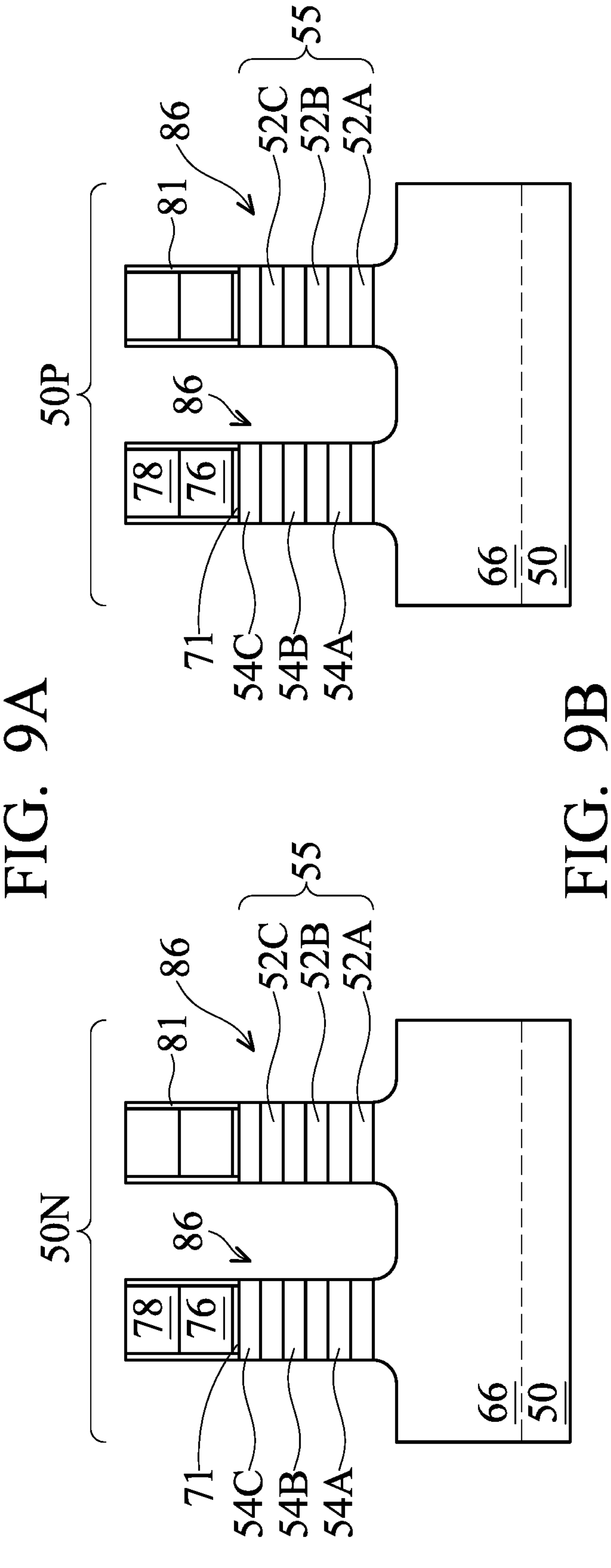

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
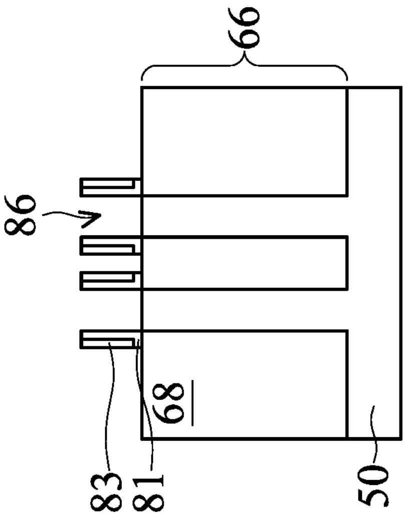
Figure 10B:
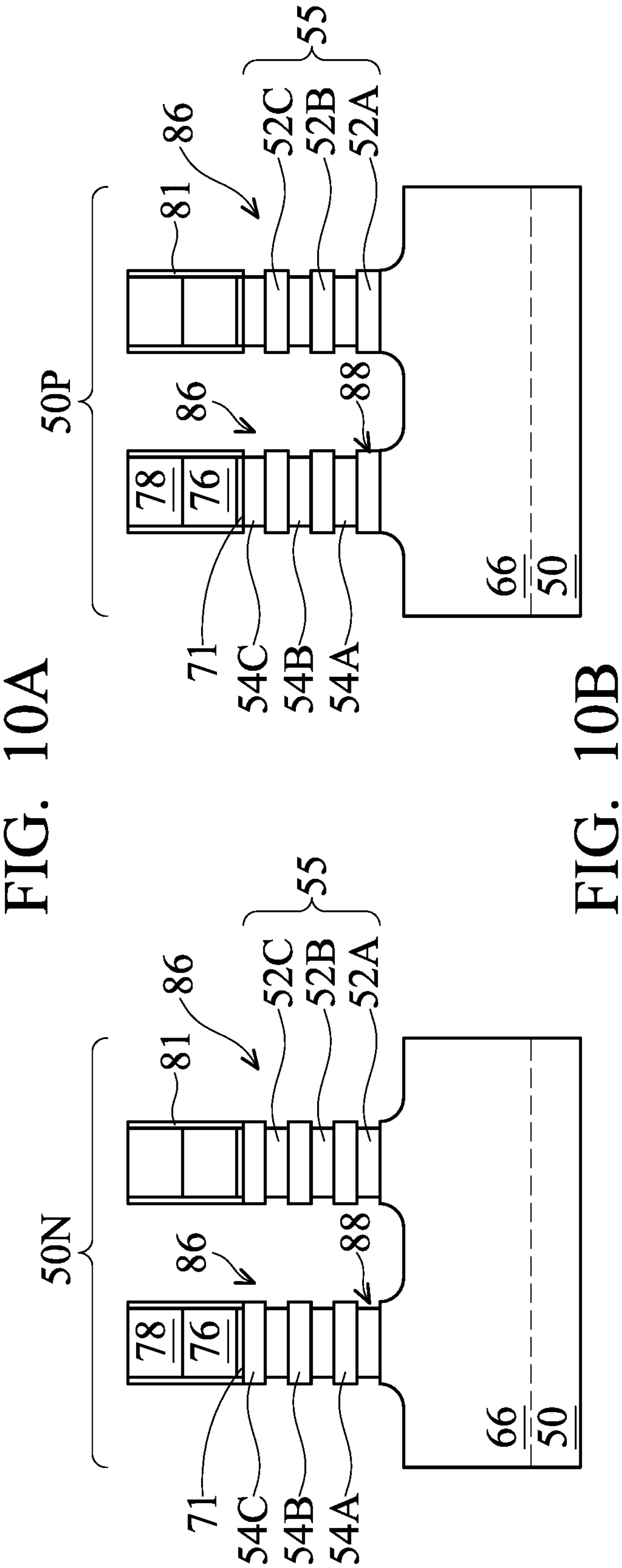

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 64 formed of the second semiconductor materials (e.g., the second nanostructures 54) exposed by the first recesses 86 are etched to form sidewall recesses 88 in the p-type regions 50P. Although sidewalls of the first nanostructures 52 and the second nanostructures 54 in the sidewall recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52 in the n-type region 50N, and a wet or dry etch process with hydrogen fluoride, another fluorine-based etchant, or the like may be used to etch sidewalls of the second nanostructures 54 in the p-type region 50P.

Figure 11A:
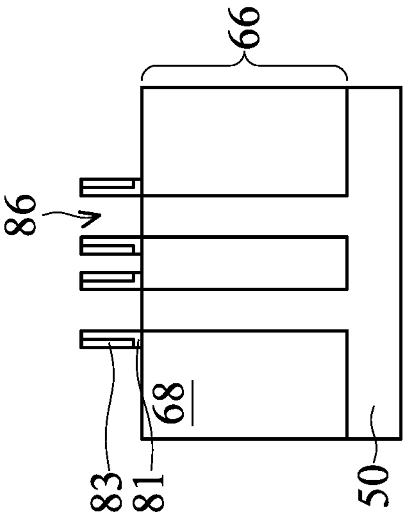
Figure 11B:
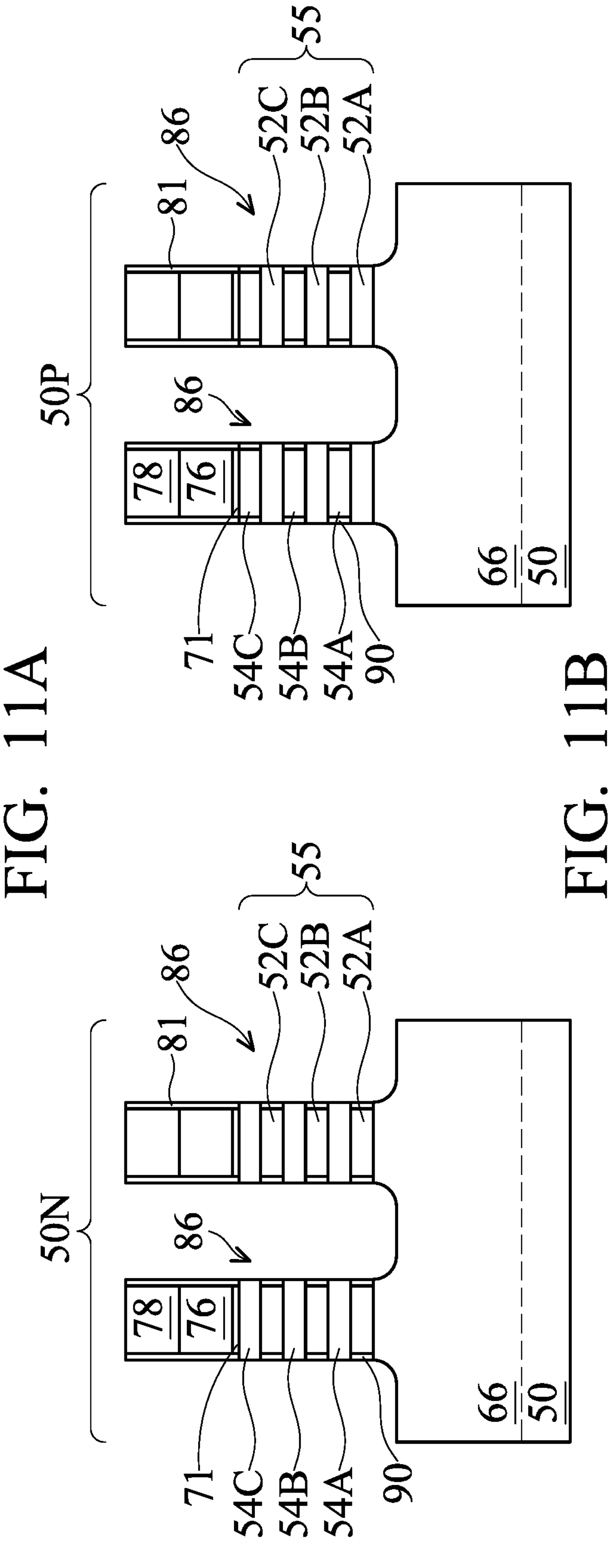
Figure 11C:
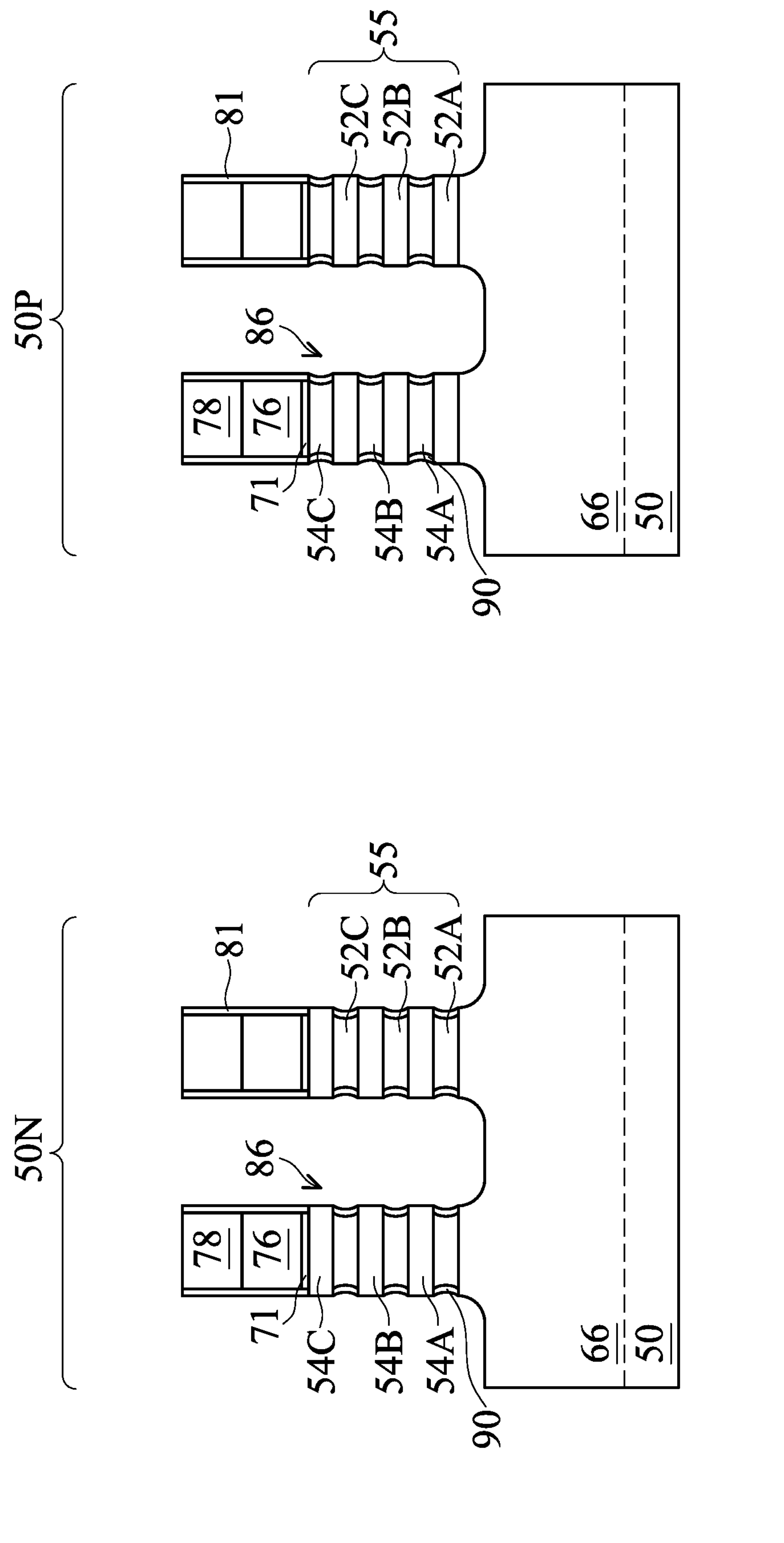

In FIGS. 11A-11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the first recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers are recessed from sidewalls of the second nanostructures 54 in the P type N-type region 50N. Also illustrated are embodiments in which sidewalls of the second nanostructures 54 are concave, outer sidewalls of the first inner spacers 90 are concave, and the first inner spacers are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A-12C) by subsequent etching processes, such as etching processes used to form gate structures.

Figure 12A:
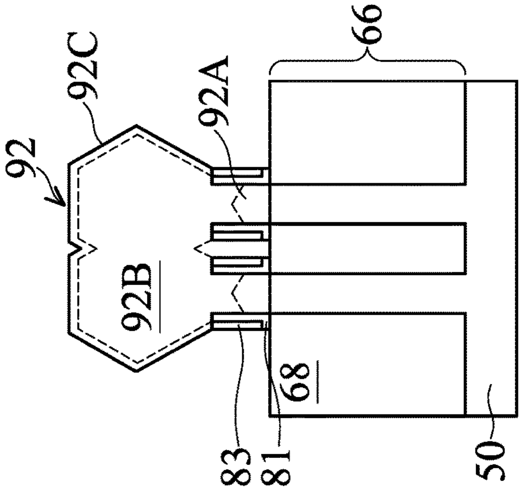
Figure 12B:
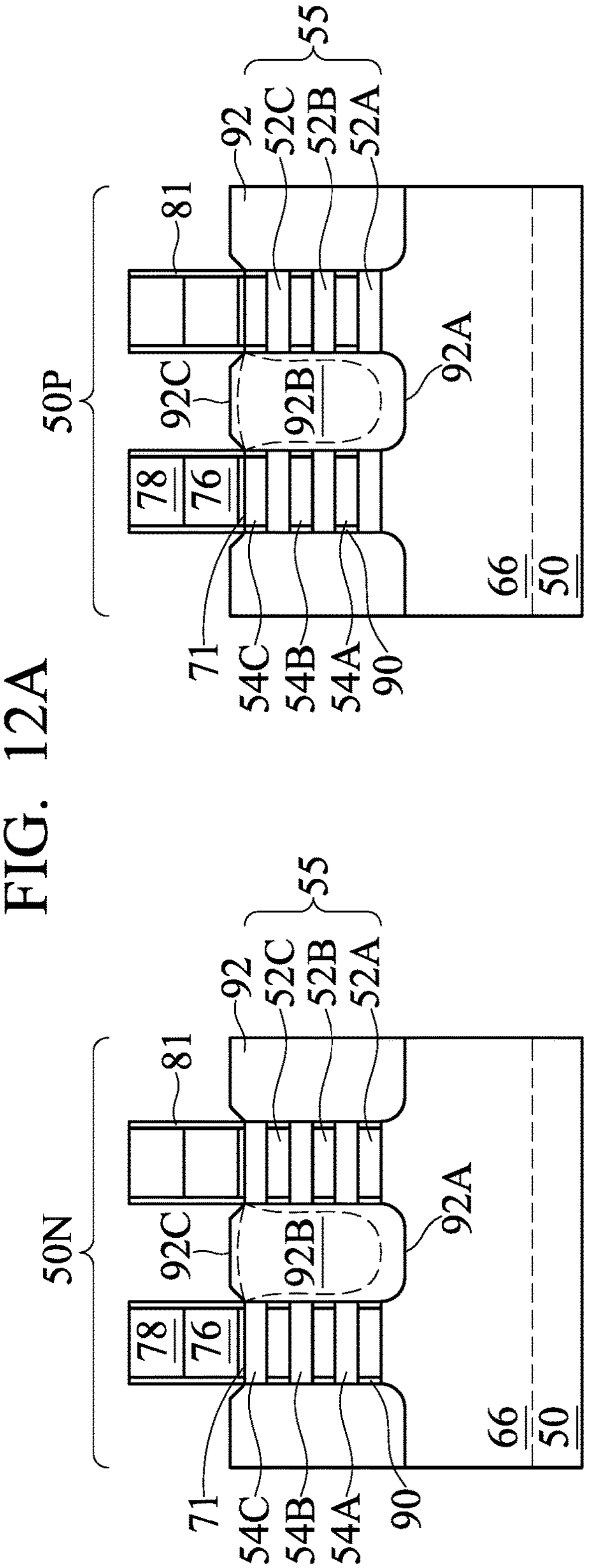
Figure 12C:
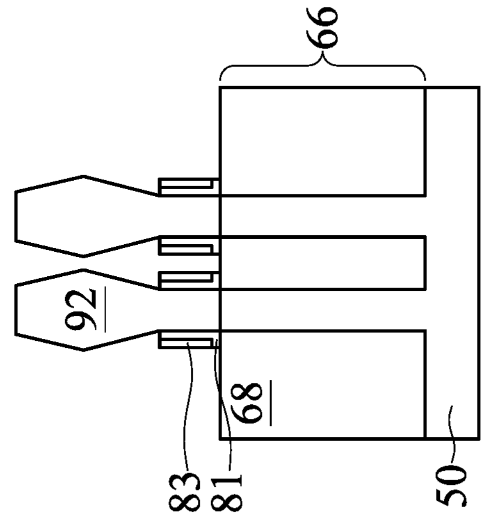

In FIGS. 12A-12C, epitaxial source/drain regions 92 are formed in the first recesses 86. In some embodiments, the epitaxial source/drain regions 92 may exert stress on the second nanostructures 54 in the n-type region 50N and on the first nanostructures 52 in the p-type region 50P, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76, and the first inner spacers 90 are used to separate the epitaxial source/drain regions 92 from the nanostructures 55 by an appropriate lateral distance so that the epitaxial source/drain regions 92 do not short out with subsequently formed gates of the resulting nanostructure-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nanostructure-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nanostructure-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/$cm^3$ and about $1\times10^{21}$ atoms/$cm^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same NSFET to merge, as illustrated by FIG. 12A. In other embodiments, adjacent epitaxial source/drain regions 92 remain separated after the epitaxy process is completed, as illustrated by FIG. 12C. In the embodiments illustrated in FIGS. 12A and 12C, the first spacers 81 may be formed to a top surface of the STI regions 68, thereby blocking the epitaxial growth. In some other embodiments, the first spacers 81 may cover portions of the sidewalls of the nanostructures 55, further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12D:
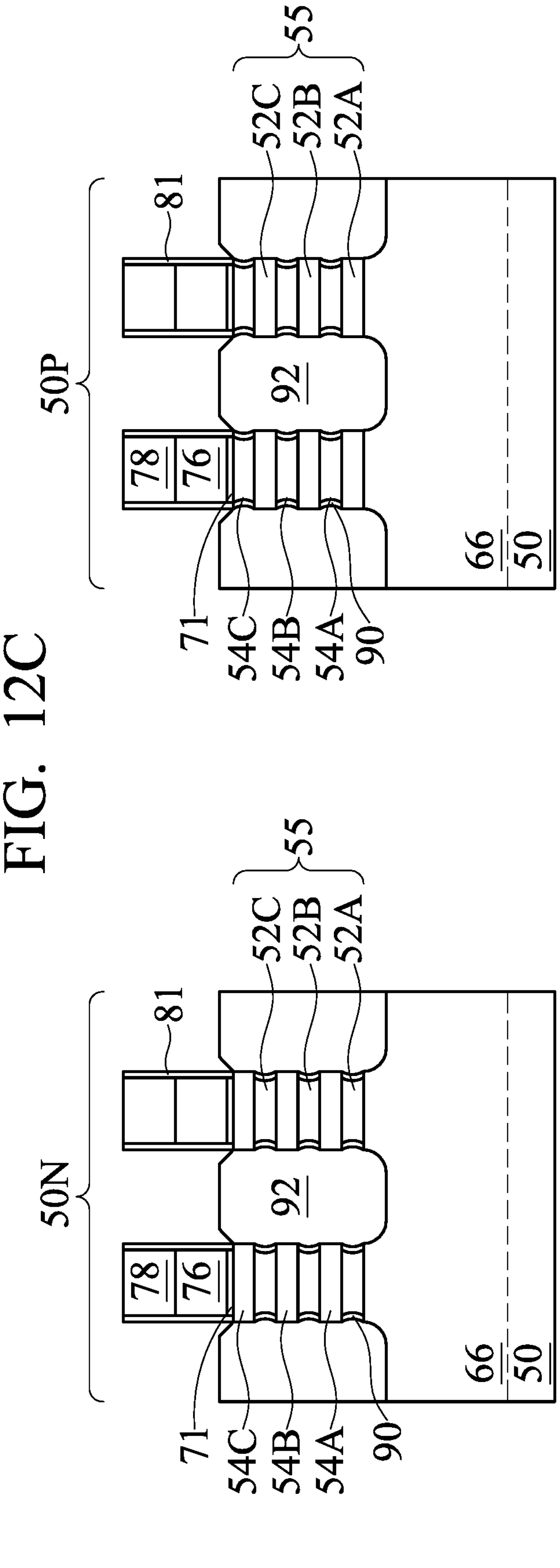

FIG. 12D illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 12D, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

Figure 13A:
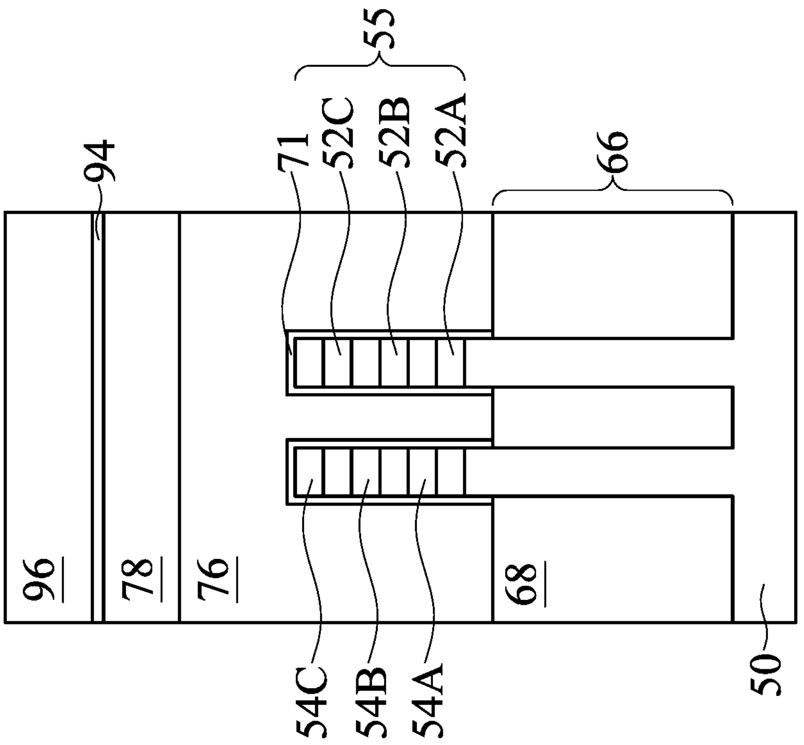
Figure 13B:
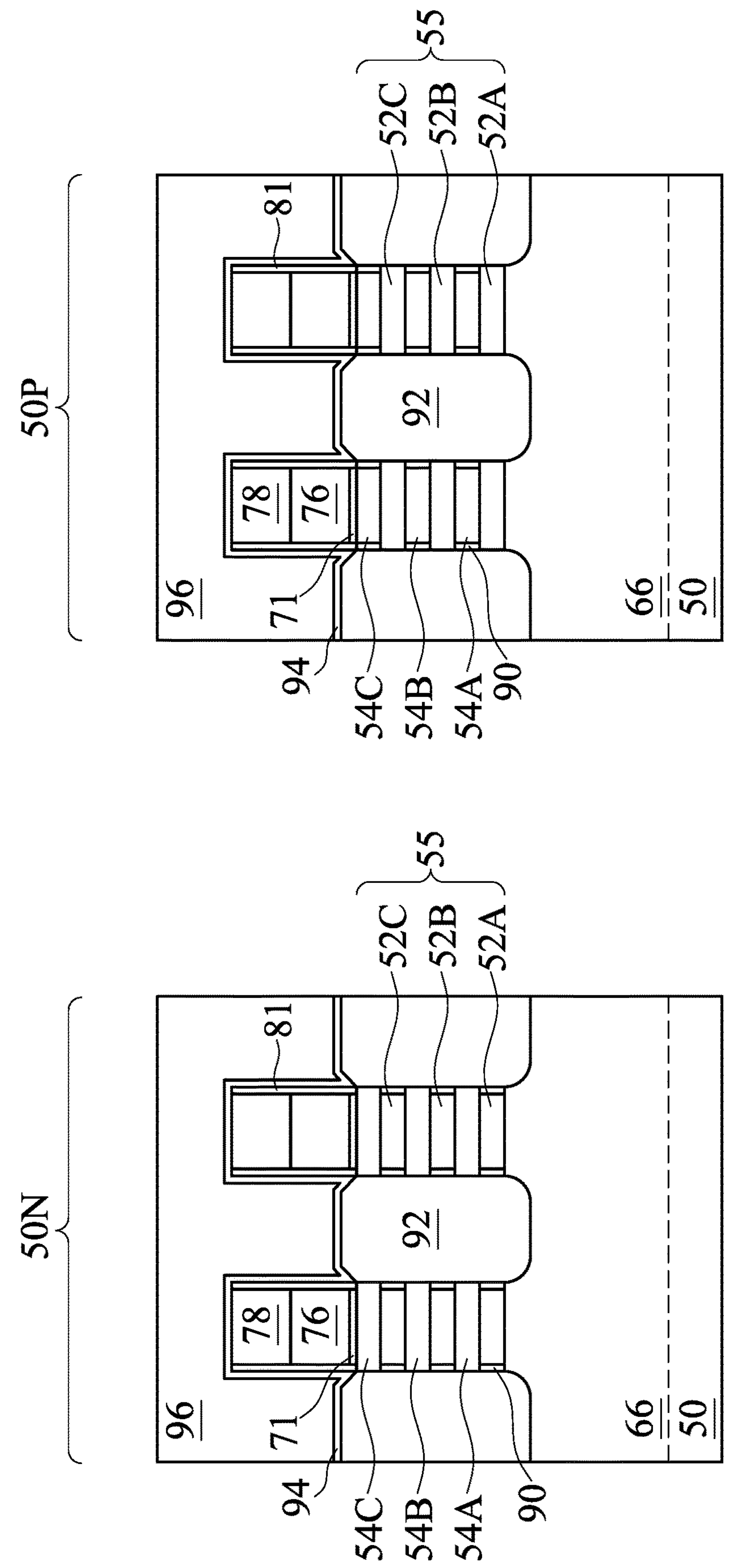
Figure 13C:
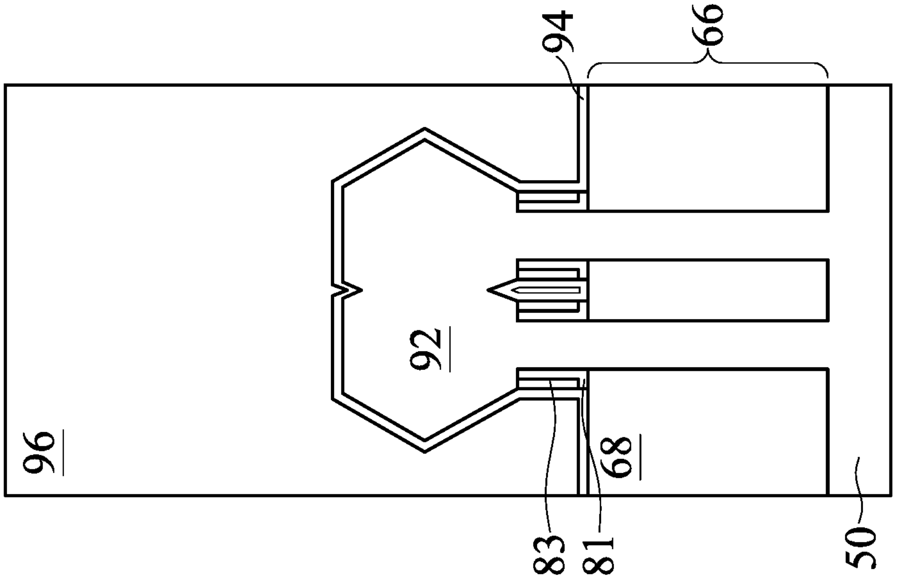

In FIGS. 13A-13C, a first interlayer dielectric (ILD) 96 is deposited over the structure illustrated in FIGS. 6A, 12B, and 12A (the processes of FIGS. 7A-12D do not alter the cross-section illustrated in FIGS. 6A), respectively. The first ILD 96 may be formed of a dielectric material and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as silicon nitride, silicon oxide, silicon oxynitride, or the like, having a different etch rate than the material of the overlying first ILD 96.

Figure 14A:
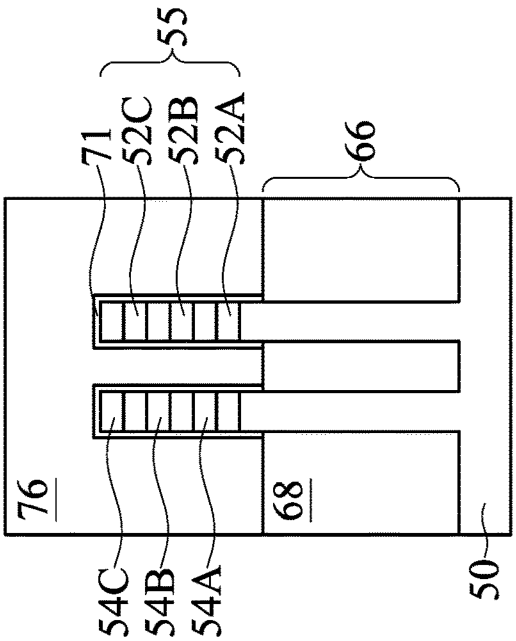
Figure 14B:
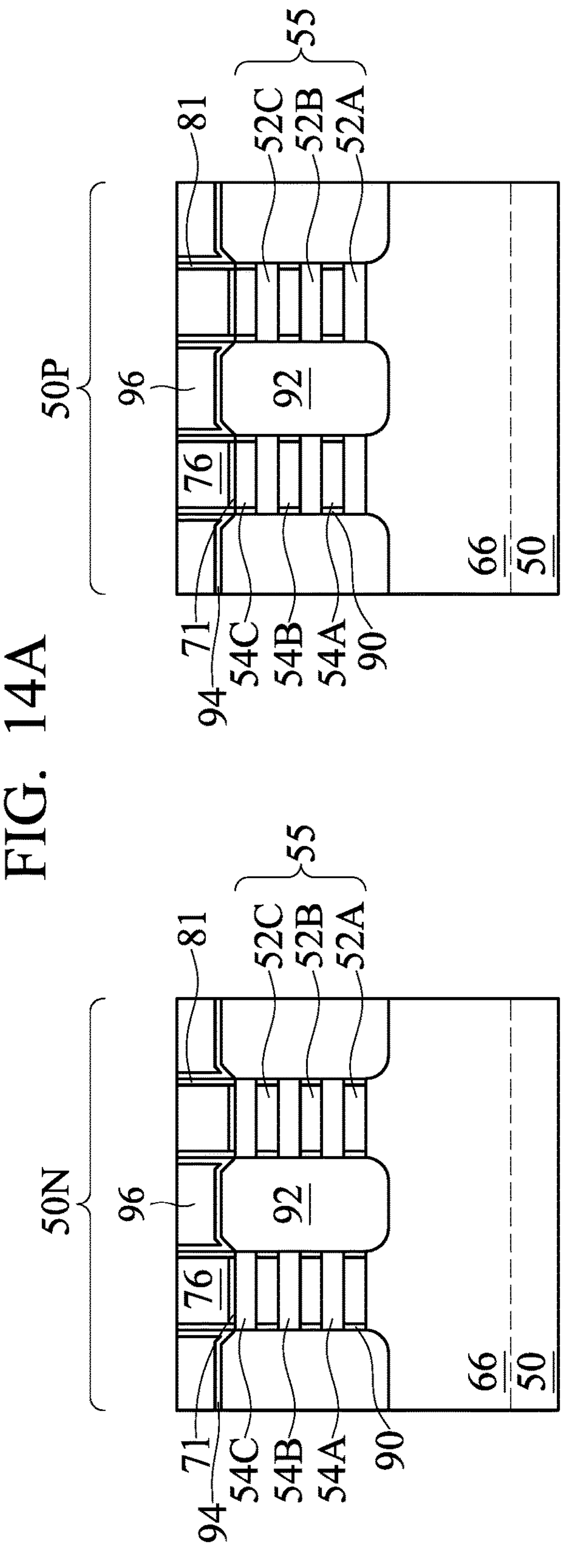

In FIGS. 14A-14B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 15A:
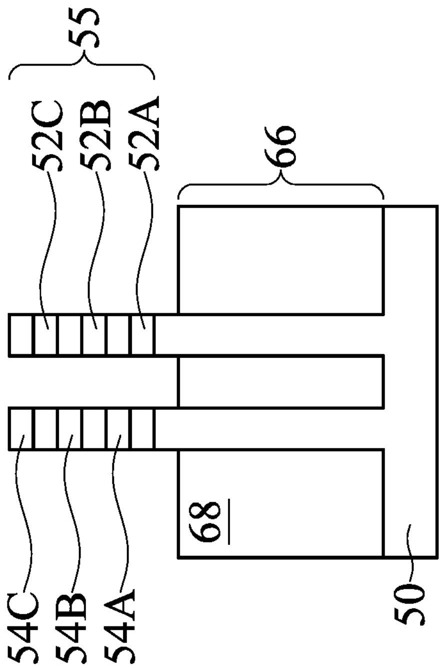
Figure 15B:
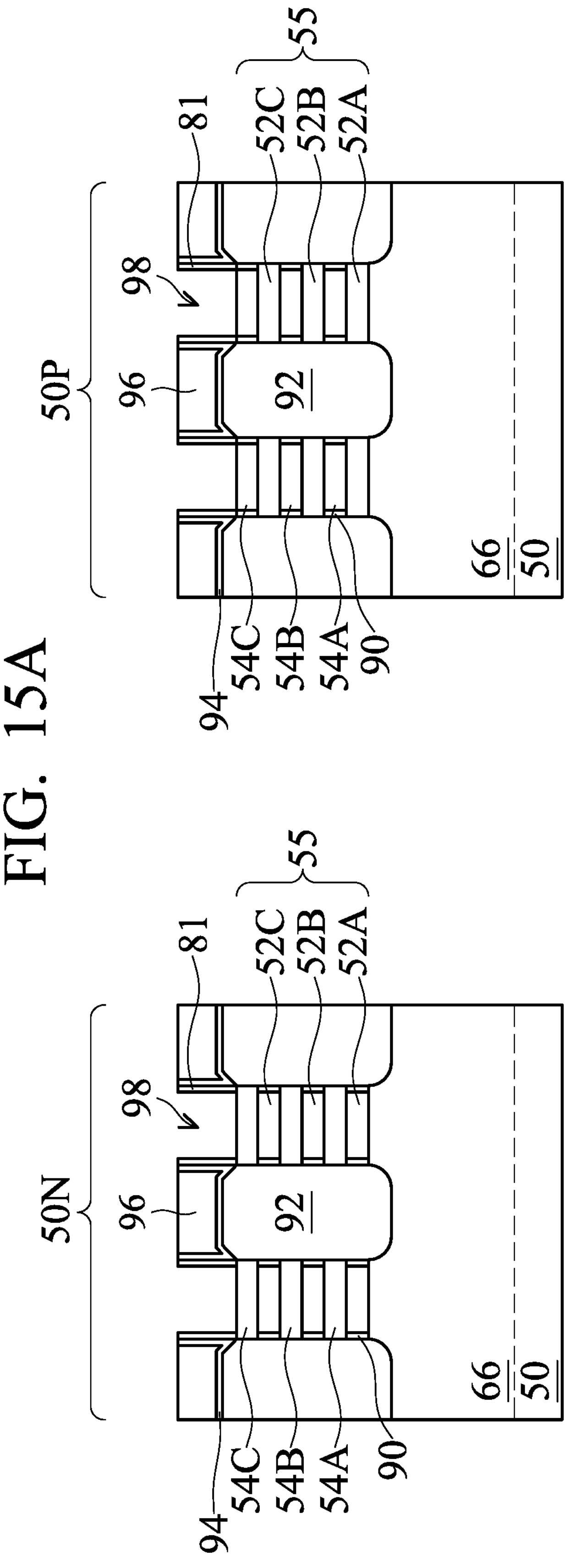

In FIGS. 15A and 15B, the dummy gates 76, and the masks 78 if present, are removed in one or more etching steps so that second recesses 98 are formed. Portions of the dummy gate dielectrics 71 in the second recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nanostructure-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16A:
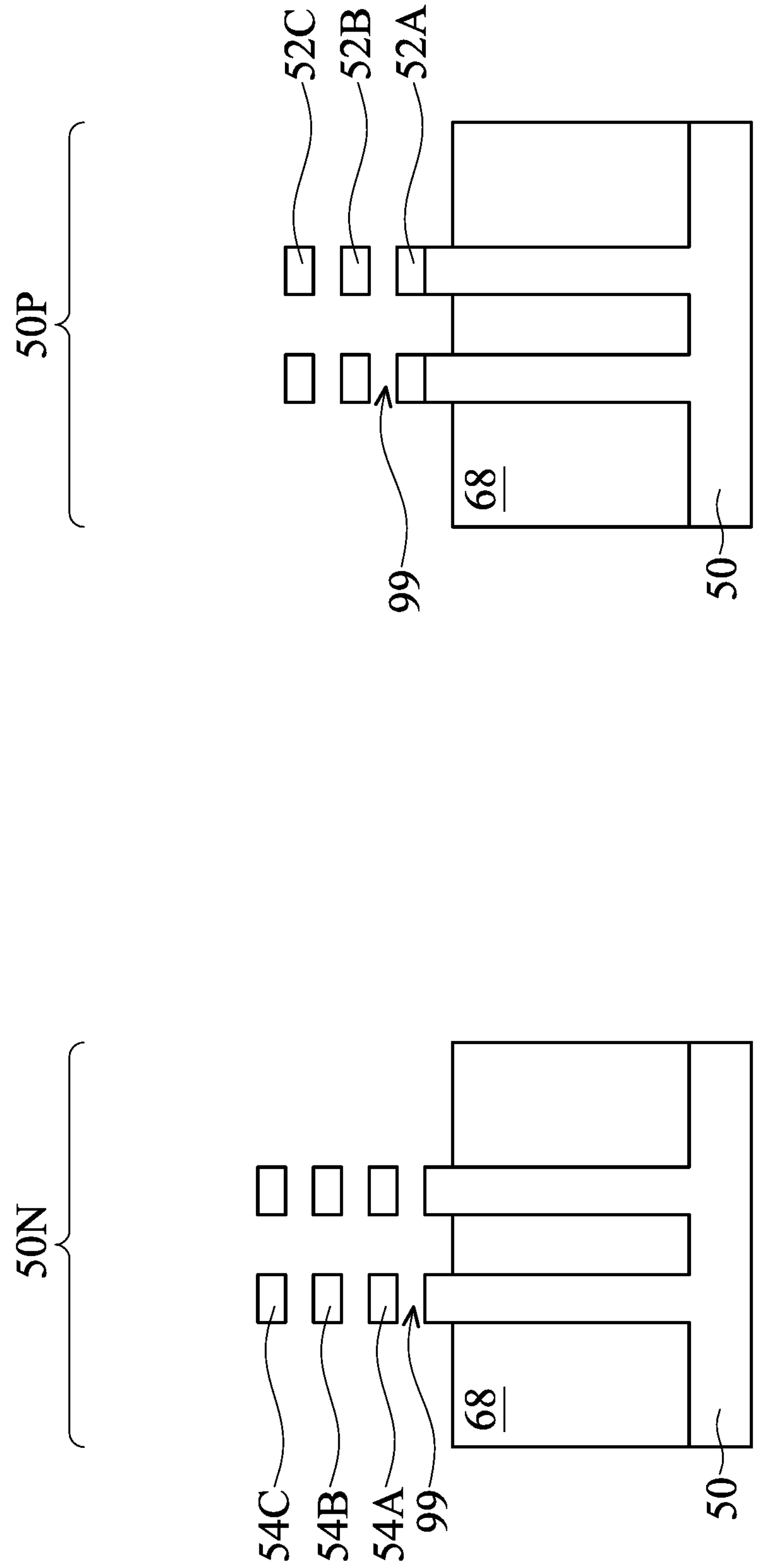
Figure 16B:
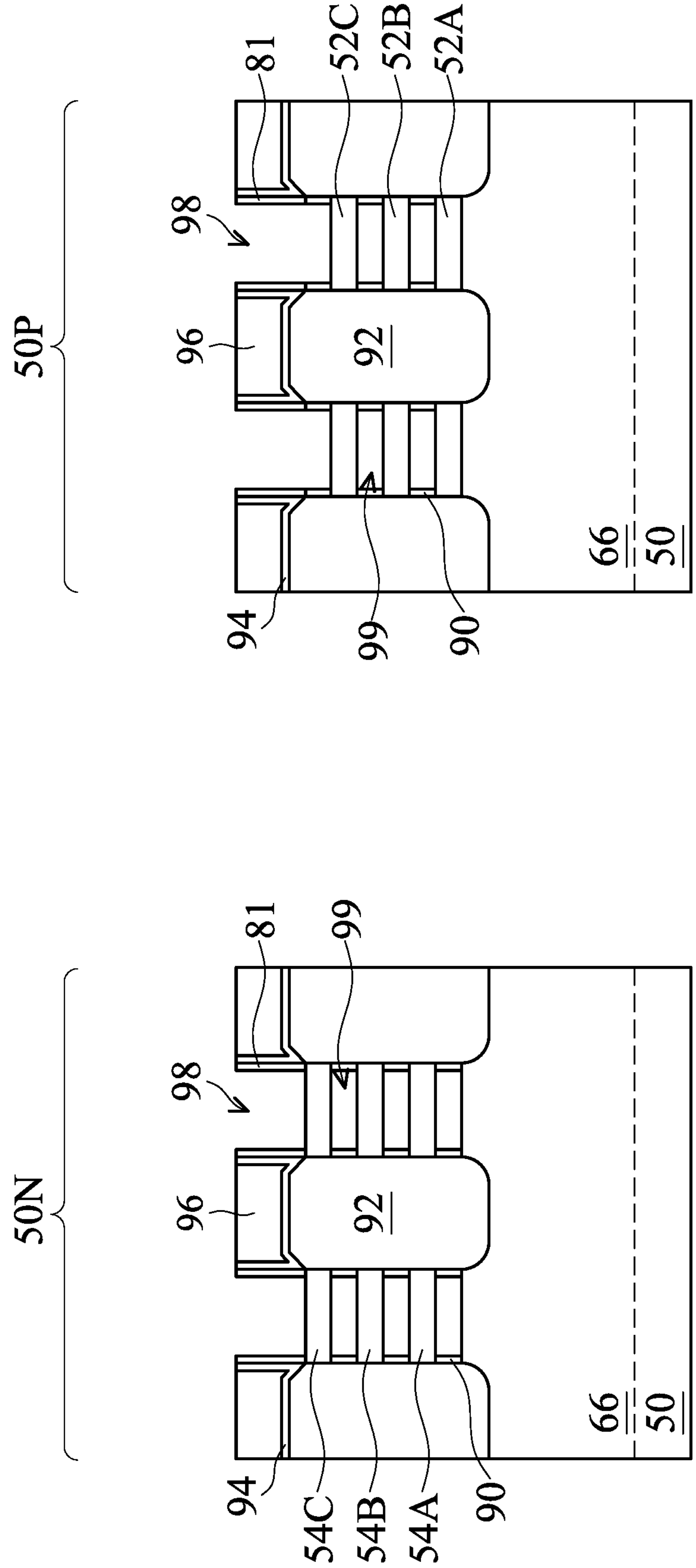

In FIGS. 16A and 16B, the first nanostructures 52 in the n-type region 50N and the second nanostructures 54 in the p-type region 50P are removed such that openings 99 are formed between the first nanostructures 52 and/or the fins 66 in the n-type region 50N and between the second nanostructures 54 in the p-type region 50P. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously, for example by removing the first nanostructures 52 in both the n-type region 50N and the p-type region 50P or by removing the second nanostructures 54 in both the n-type region 50N and the p-type region 50P. In such embodiments, channel regions of n-type NSFETs and p-type NSFETS may have a same material composition, such as silicon, silicon germanium, or the like. FIGS. 24A, 24B, and 24C illustrate a structure resulting from such embodiments where the channel regions in both the p-type region 50P and the n-type region 50N are provided by the second nanostructures 54 and comprise silicon, for example.

Figure 17A:
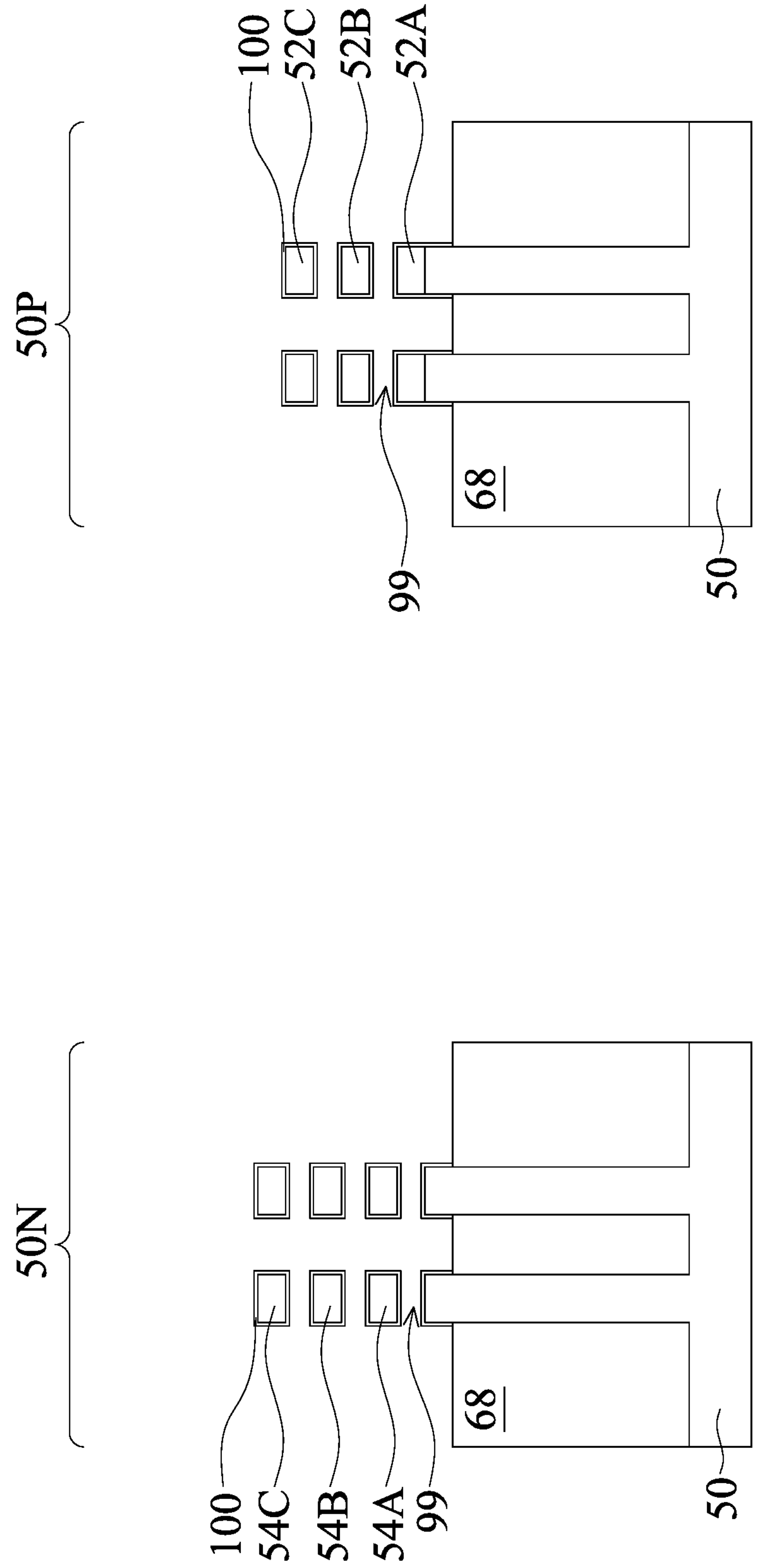
Figure 17B:
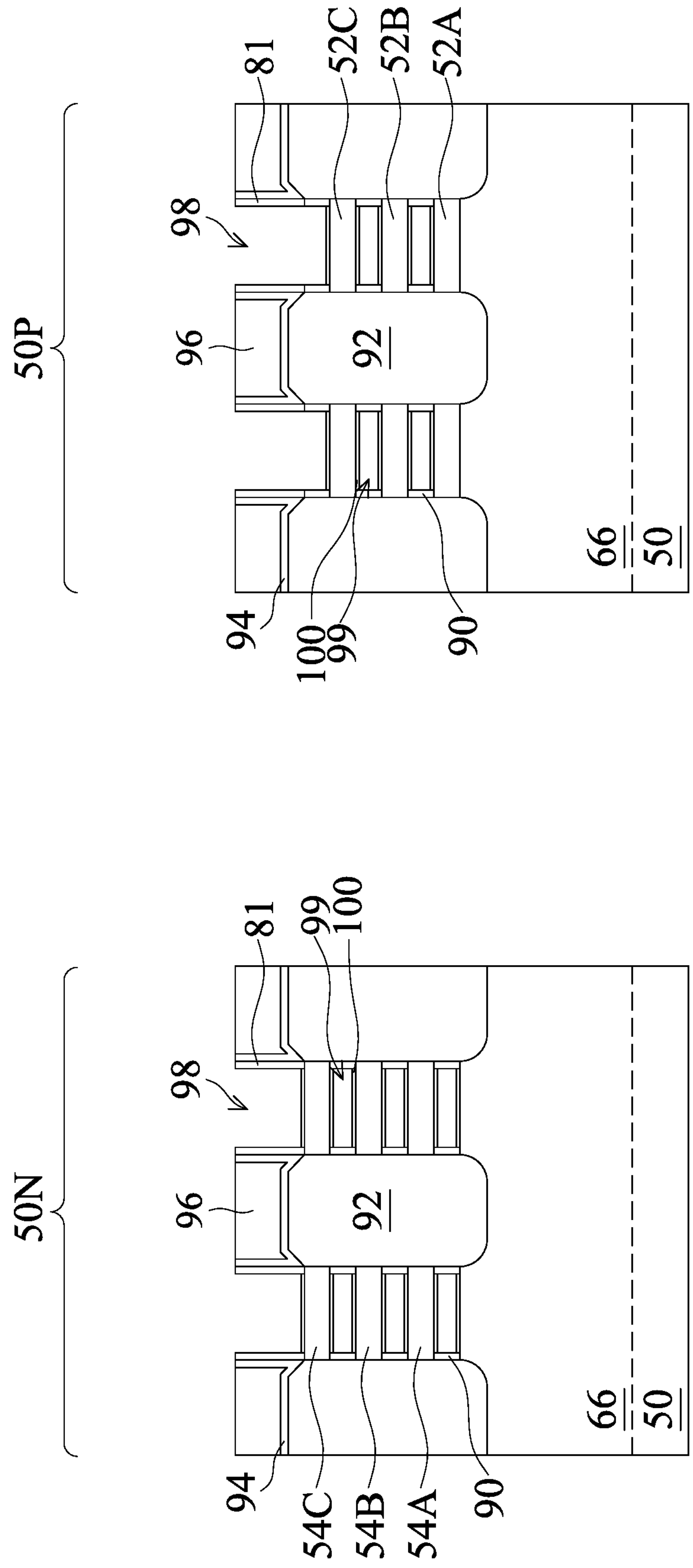

Next, replacement gates are formed in the second recesses 98 and the openings 99. In FIGS. 17A and 17B, an interfacial layer 100 is formed over exposed surfaces of the first nanostructures 52, the second nanostructures 54, and the fins 66 in accordance with some embodiments. The interfacial layer 100 may include silicon oxide and may include terminal hydroxyl groups on its surface. The interfacial layer 100 may have a thickness of about 10 angstroms to about 30 angstroms. In some embodiments, the interfacial layer 100 may have a thickness that is at least five times greater than a thickness of a first dielectric layer 104. In some embodiments, the interfacial layer 100 may have a thickness of about 0.6 to about 2 times a thickness of a second dielectric layer 106 (see below, FIGS. 19A and 19B) In some embodiments, chemical oxidization using an oxidizing agent such as SPM (a mixture of H2SO4 and H2O2), SC1 (a mixture of $NH_4OH$ and H2O2), or ozone-deionized water (a mixture of O3 and deionized water) is performed to oxidize exterior portions of the first nanostructures 52, the second nanostructures 54 and the fins 66. In some embodiments, to form the interfacial layer 100 a thermal oxidization is performed by treating (e.g., soaking) the first nanostructures 52, the second nanostructures 54, and the fins 66 in an oxygen-containing gas source, where the oxygen-containing gas source includes, e.g., N2O, O2, a mixture of N2O and H2, or a mixture of O2 and H2, as examples. The thermal oxidization may be performed at a temperature between about 500° C. and about 1000° C. Note that in the illustrated embodiment, the interfacial layer 100 is formed by oxidizing the exterior portions of the first nanostructure 52, the second nanostructures 54, and the fins 66 into an oxide, and therefore, the interfacial layer 100 is selectively formed over the exposed surfaces of the first nanostructures 52, the second nanostructures 54, and the fins 66, and is not formed over other surfaces, such as the sidewalls of the first inner spacers 90 and the first spacers 81.

Next, referring to FIGS. 18A-19B, gate dielectric structures 102 (see FIGS. 19A-19B) are formed in the second recesses 98 and the openings 99 in accordance with some embodiments. As discussed in greater detail below, the gate dielectric structures 102 may comprise multiple layers. For example, the gate dielectric structures 102 may have a first dielectric layer 104 and a second dielectric layer 106, wherein the first dielectric layer 104 may exhibit a higher oxygen areal density than that of the second dielectric layer 106. Dipoles may be created in the collective gate dielectric structures (e.g., between the interfacial layer 100 and the first dielectric layer 104) for tuning the threshold voltage (Vt) of the nanostructure-FETs. In some embodiments, the second dielectric layer 106 has a small capacitance equivalent thickness (CET) and a relatively thick physical thickness. The CET is a comparison to the capacitance to a layer of silicon dioxide (e.g., a thickness of a layer required for achieving a specified capacitive coupling of 1 nm silicon dioxide). As such, the gate dielectric structures 102 may allow the tuning of threshold voltage ($V_t$) while not significantly increasing the CET of the gate dielectric structures 102.

In some embodiments the gate dielectric structures 102 may have a dielectric constant greater than about 7.0. In the n-type region 50N, the gate dielectric structures 102 may be formed over top surfaces and sidewalls of the fins 66 and over top surfaces, sidewalls, and bottom surfaces of the second nanostructures 54 (e.g., wrapping around the respective second nanostructures 54), and in the p-type region 50P, the gate dielectric structures 102 may be formed over sidewalls of the fins 66 and over top surfaces, sidewalls, and bottom surfaces of the first nanostructures 52 (e.g., wrapping around the respective first nanostructures 52). The gate dielectric structures 102 may also be deposited over top surfaces of the first ILD 96, the CESL 94, the first spacers 81, and the STI regions 68.

Figure 18A:
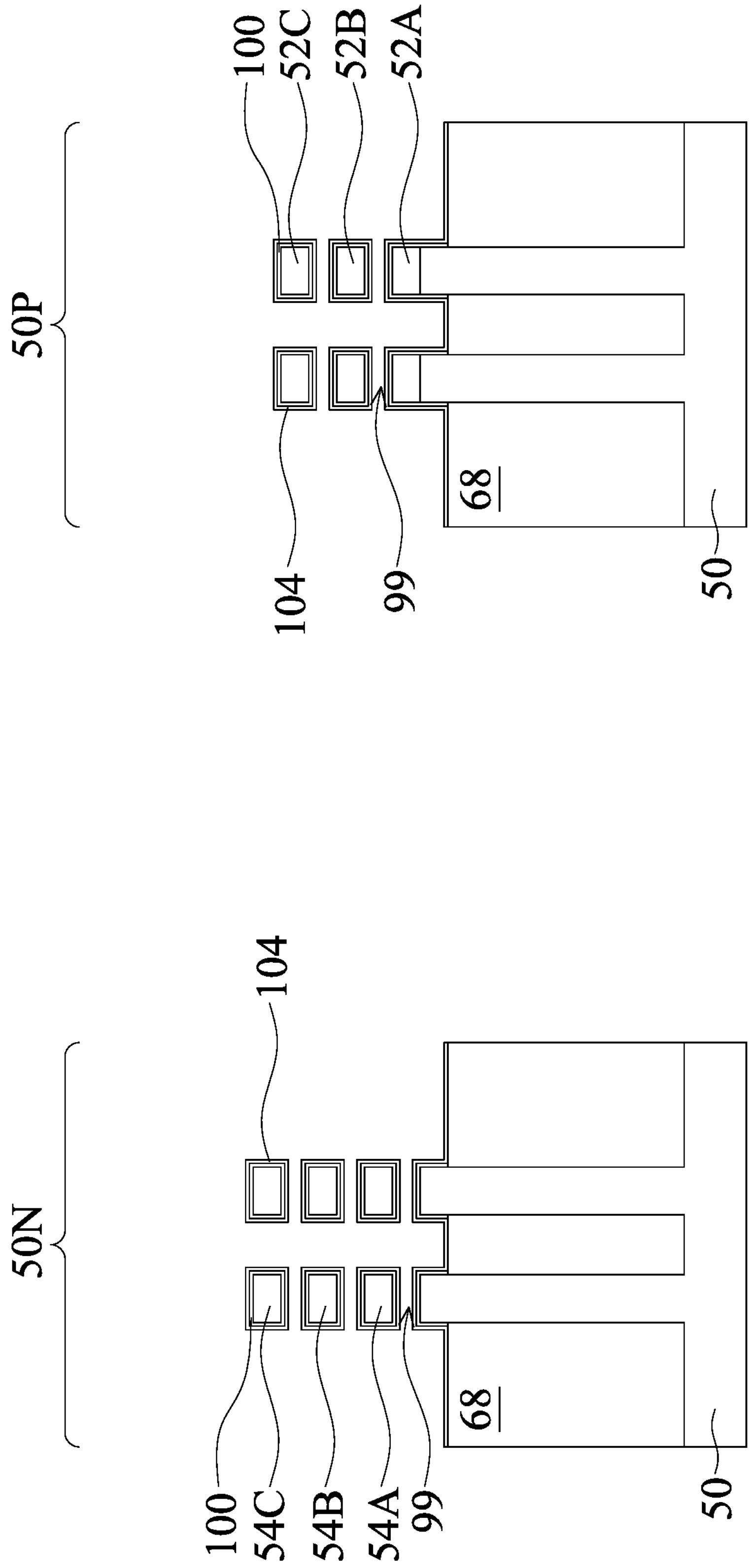
Figure 18B:
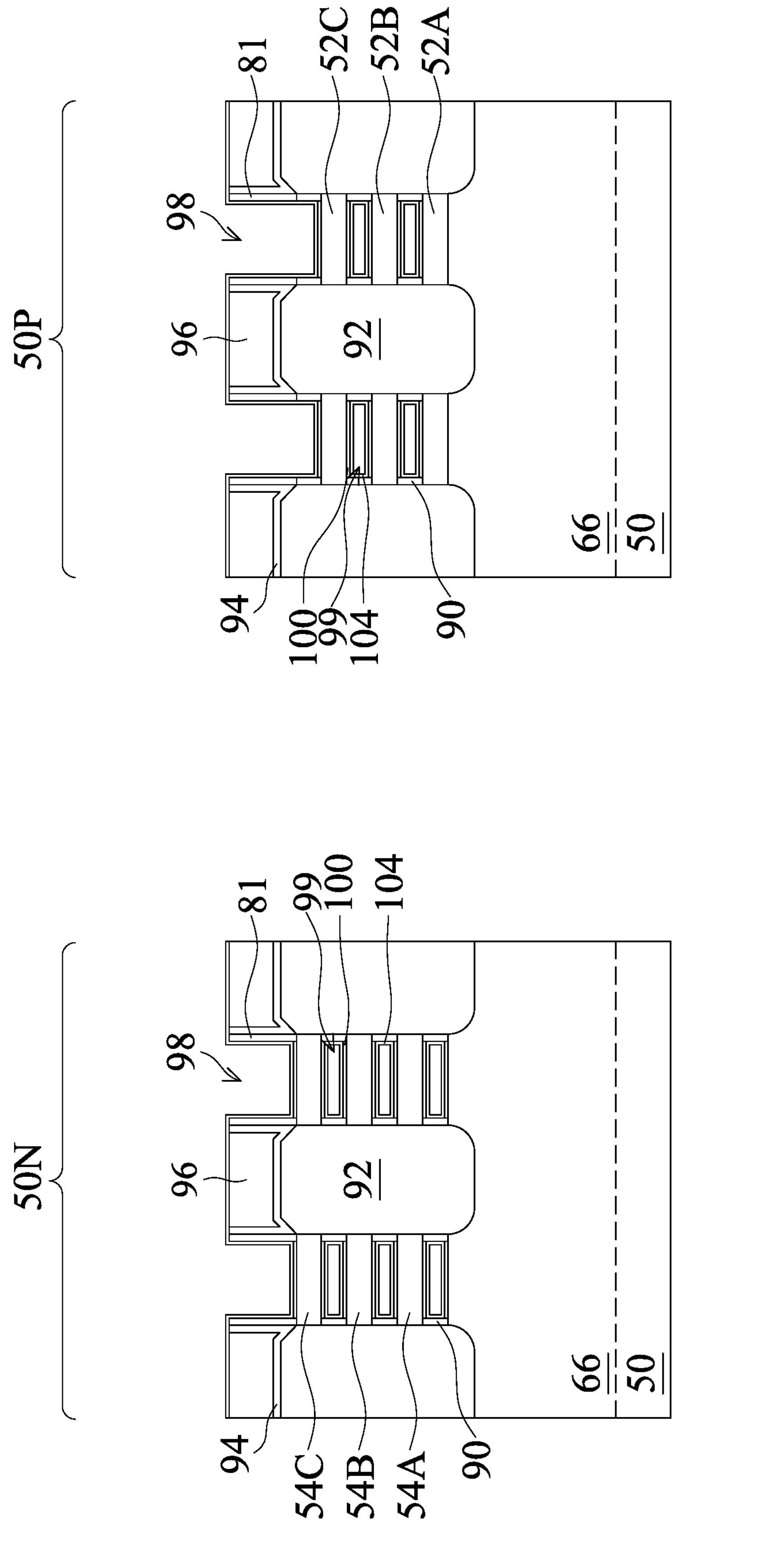

Referring first to FIGS. 18A-18B, a first dielectric layer 104 of the gate dielectric structures 102 is formed. In some embodiments, the first dielectric layer 104 is one to three mono-layers of a first metal oxide (e.g., formed by one to three ALD cycles) disposed over (e.g., bonded to) the interfacial layer 100. The first metal oxide may be an oxide of a first metal. The first metal may be selected from a metal where its oxide has an areal oxygen density greater than that of the second metal oxide in the second dielectric layer 106 (see below, FIGS. 19A and 19B). The greater areal oxygen densities of the first metal oxide may create dipoles for positive flat-band voltage Vfb shifting near and at the interface between the interfacial layer 100 and the first dielectric layer 104, thereby reducing a Vfb roll-off problem for a PMOS device. In some embodiments, the first metal is selected from aluminum, zinc, gallium, hafnium, or other metal elements that are suitable for creating dipoles in a gate dielectric structure of a transistor.

Figure 25:
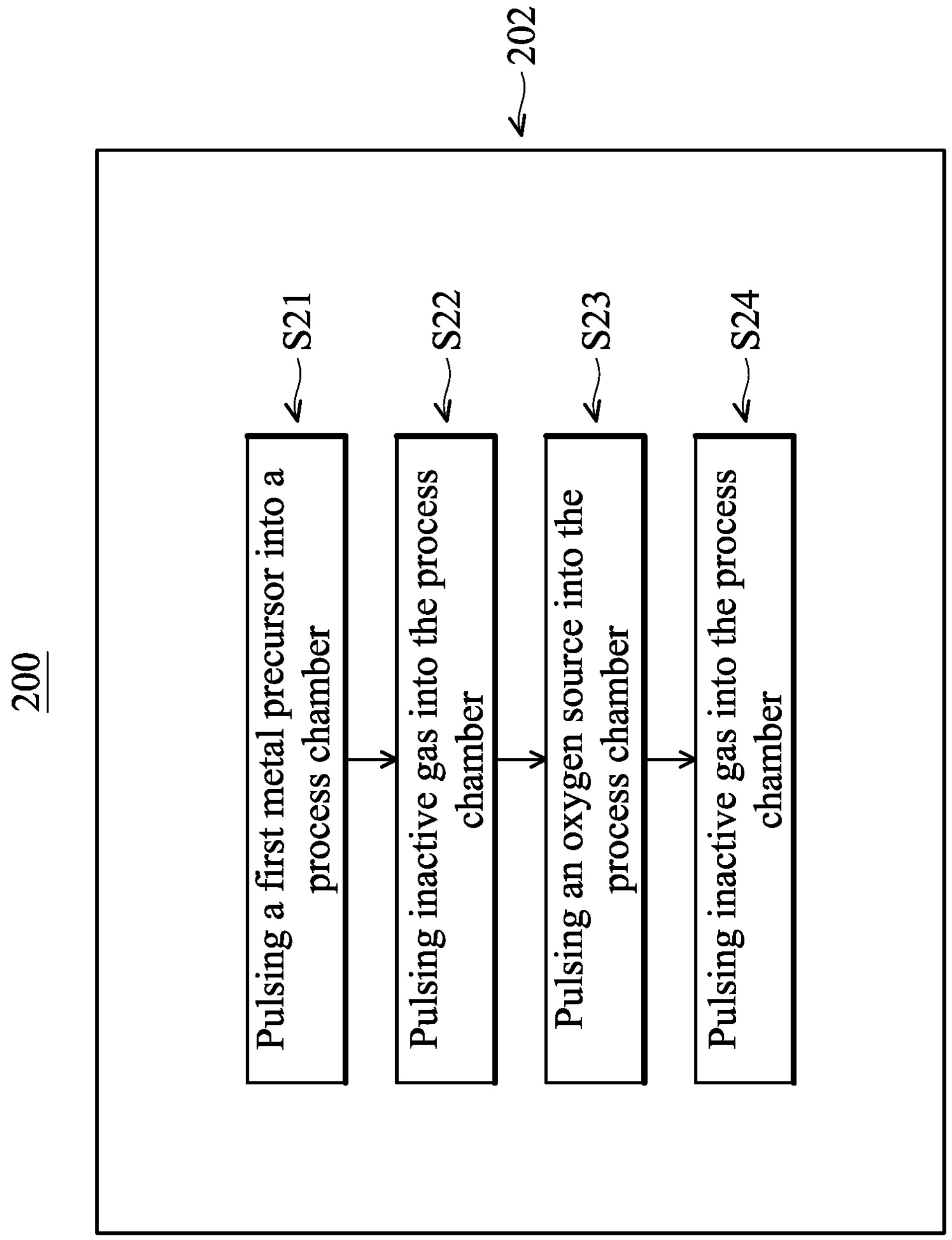
FIGS. 25 and 26 are flow charts of atomic layer processes for forming gate dielectric layers, in accordance with some embodiments.

The first dielectric layer 104 of the gate dielectric structures 102 may be formed by an ALD process 200 illustrated in FIG. 25. In some embodiments, some preparation steps (not shown), such as purging the process chamber or stabilizing the temperature of the chamber or the substrate may be performed before the ALD process 200 starts. ALD process 200 may start at Step S21, where a first metal precursor is pulsed to the process chamber so that the interfacial layer 100, including the terminal hydroxyl groups on its surface, is exposed to the first metal precursor. In some embodiments, the first metal precursor includes trimethylaluminum (TMA), aluminum trichloride, dimethylzinc, diethylzinc, trimethylgallium, triethylgallium, hafnium tetrachloride ($HfCl_4$), $Hf(NO_3)_4$, $Hf[N(CH_3)_2]_4$, $Hf[N(C_2H_5)_2]_4$, $Hf[N(CH_3)(C_2H_5)]_4$, or a combination thereof. In some embodiments, the first metal precursor is carried by a carrier gas to pulse into the process chamber, with a flow rate of about 300 sccm to about 1000 sccm. The carrier gas may include $N_2$, Ar, He, other inert gas, or a combination thereof. In some embodiments, the first metal precursor may have a temperature of about 30° C. to about 80° C. before being pulsed into the process chamber for maintaining appropriate vapor pressure.

In some embodiments, during step S21, a monolayer of the first metal precursor is adsorbed onto the surface of the interfacial layer 100 through ligand exchange. In some embodiments where the first metal precursor is TMA, the TMA reacts with the terminal hydroxyl groups of the interfacial layer 100 so that aluminum atoms of the TMA bonds to the oxygen atoms of interfacial layer 100 and forms a monolayer (e.g., $Al(CH_3)_2$) deposited over the interfacial layer 100 and byproducts of $CH_4$. In some embodiments, when performing step S21, the substrate 50 (e.g., the nanostructure-FETs) is heated to about 200° C. to about 400° C. for facilitating the ligand exchange reaction. Step S21 may be performed for more than about 0.1 seconds for providing sufficient first metal precursor to be adsorbed by self-limiting reactions on the surface of interfacial layer 100, e.g., creating a first-metal-precursor saturated surface. Also, Step 21 may be performed for less than 5 seconds to avoid substantial portions of the first metal precursor from being desorbed from the surface of the interfacial layer 100 after the surface is saturated.

Next, in step S22 an inactive gas is pulsed to the process chamber to purge the process chamber, such as flushing out unreacted remains of first metal precursor and any byproducts generated in step S21, in accordance with some embodiments. The inactive gas may include Ar, $N_2$, He, other inert gases, or combinations thereof. Step S22 may be performed for about 1 second to about 10 seconds.

In Step S23, an oxygen source is pulsed into the process chamber in accordance with some embodiments. The oxygen source may react with the first metal precursor adsorbed on the interfacial layer 100, thereby forming the monolayer of metal oxide, e.g., aluminum oxide in the example discussed above. For example, the remaining ligands of the first metal precursor will be replaced with oxygen atoms and terminal hydroxyl groups. In some embodiments, the oxygen source includes water, hydrogen peroxide, alcohol, oxygen, ozone, or a combination thereof. In some embodiments, when performing step S23, the substrate 50 is heated to about 200° C. to about 400° C. Step S23 may be performed for about 0.1 seconds to about 10 seconds. Next, S24 is performed, an inactive gas is pulsed to the process chamber to purge the process chamber, such as flushing out the oxygen source and any by-products generated in step S23, in accordance with some embodiments.

In some embodiments, the step S21 to step S24 constitutes a cycle 202, and the cycle 202 may be performed one to or more times, such as one to three times, to form the first dielectric layer 104. In some embodiments, the first dielectric layer 104 of the gate dielectric structures 102 has a thickness of less than about 4 angstroms. In some embodiments, the first dielectric layer 104 of the gate dielectric structures 102 is only a monolayer of the first metal oxide and may have a thickness of about 1.2 angstroms.

Figure 19A:
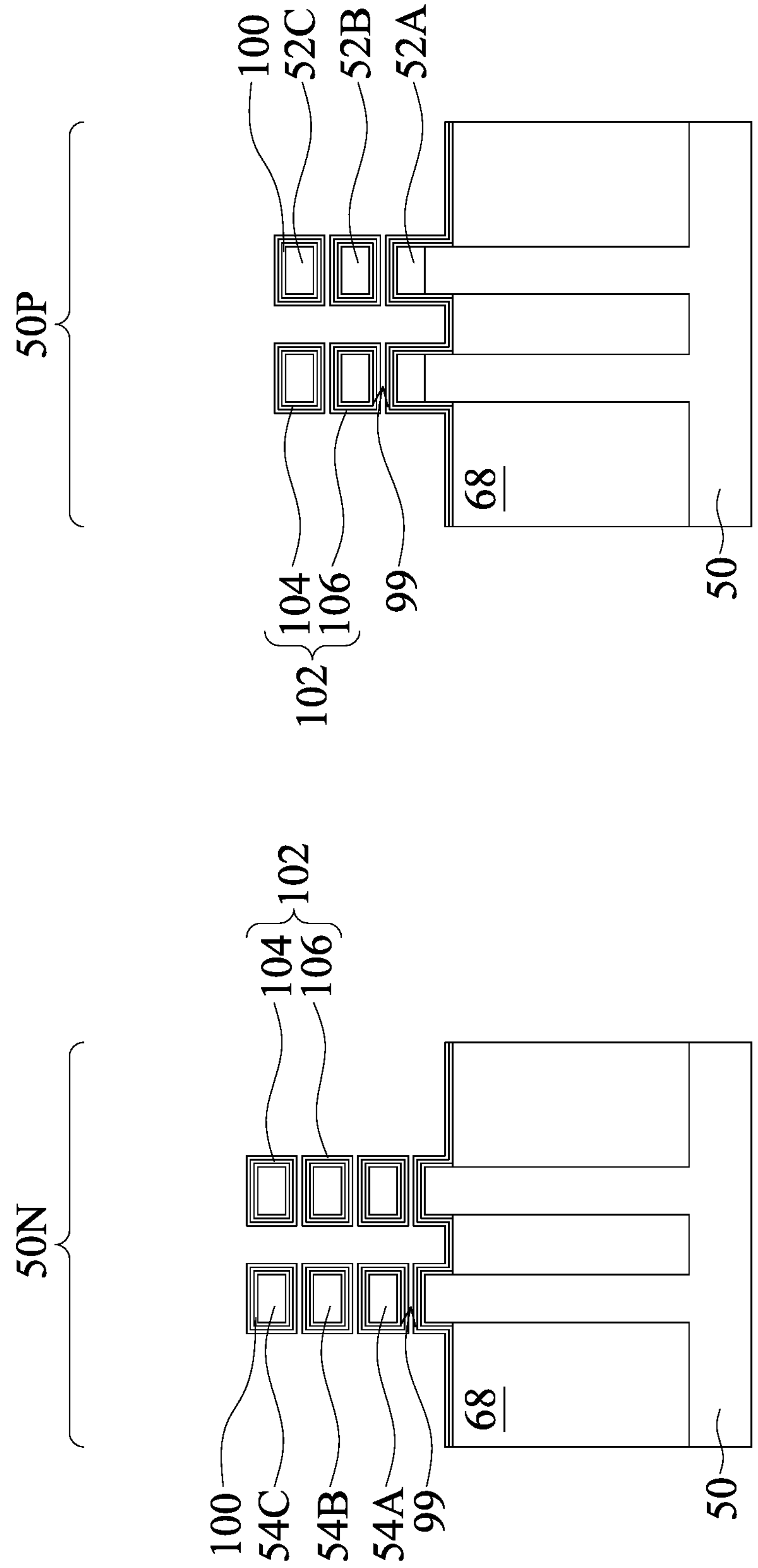
Figure 19B:
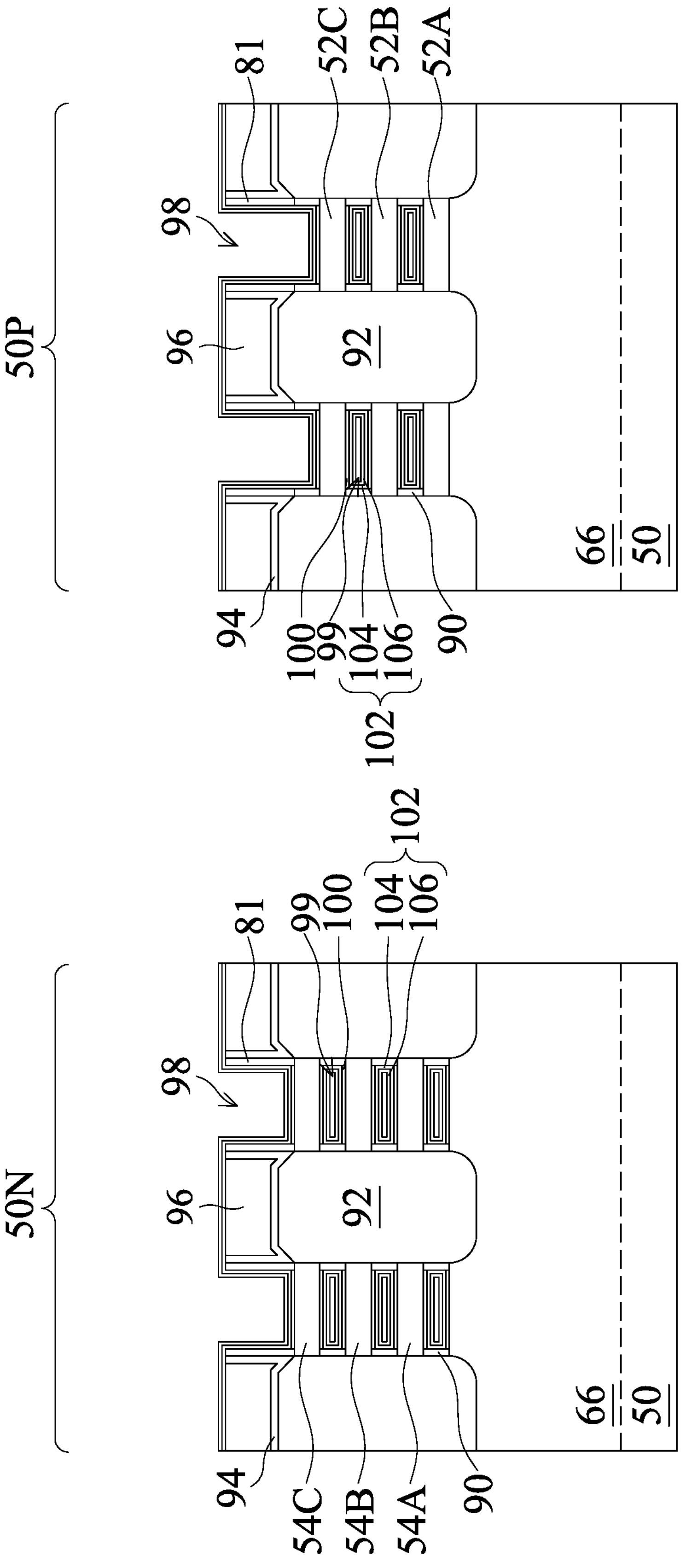

Referring now to FIGS. 19A-19B, a second dielectric layer 106 is formed over the first dielectric layer 104, wherein the first dielectric layer 104 and the second dielectric layer are collectively referred to as the gate dielectric structures 102. In some embodiments, the second dielectric layer 106 may be a relatively thick high-k material. For example, the second dielectric layer 106 may be an oxide or silicate of a second metal. The second metal may be different from the first metal and may be selected from a metal element where an oxide of the second metal has a smaller CET than the CET of the first metal oxide. For example, the second metal may be selected from hafnium, aluminum, zirconium, lanthanum, manganese, barium, titanium, lead, yttrium, or combinations thereof. For example, in the illustrated embodiments where the first metal is aluminum, the second metal may be hafnium, or in the illustrated embodiments where the first metal is hafnium, the second metal may be lanthanum. In some embodiments, the second dielectric layer 106 has a thickness of about 10 angstroms to about 20 angstroms. In some embodiments, the thickness of the second dielectric layer 106 is about three to six times greater than the thickness of the first dielectric layer 104. As a result, the gate dielectric structures 102 may exhibit the high-k characteristics that are similar to the relatively thick second dielectric layer 106 and not be significantly affected by the relatively thin first dielectric layer 104. In some embodiments, the second dielectric layer 106 has a CET of about 0.24 nm to about 0.36 nm, and the gate dielectric structure 102 may have a CET of about 0.28 nm to about 0.53 nm. In some embodiments, the CET of the second dielectric layer 106 and the CET of the gate dielectric structure 102 may have a difference in a range from about 0.04 nm to about 0.29 nm.

Figure 26:
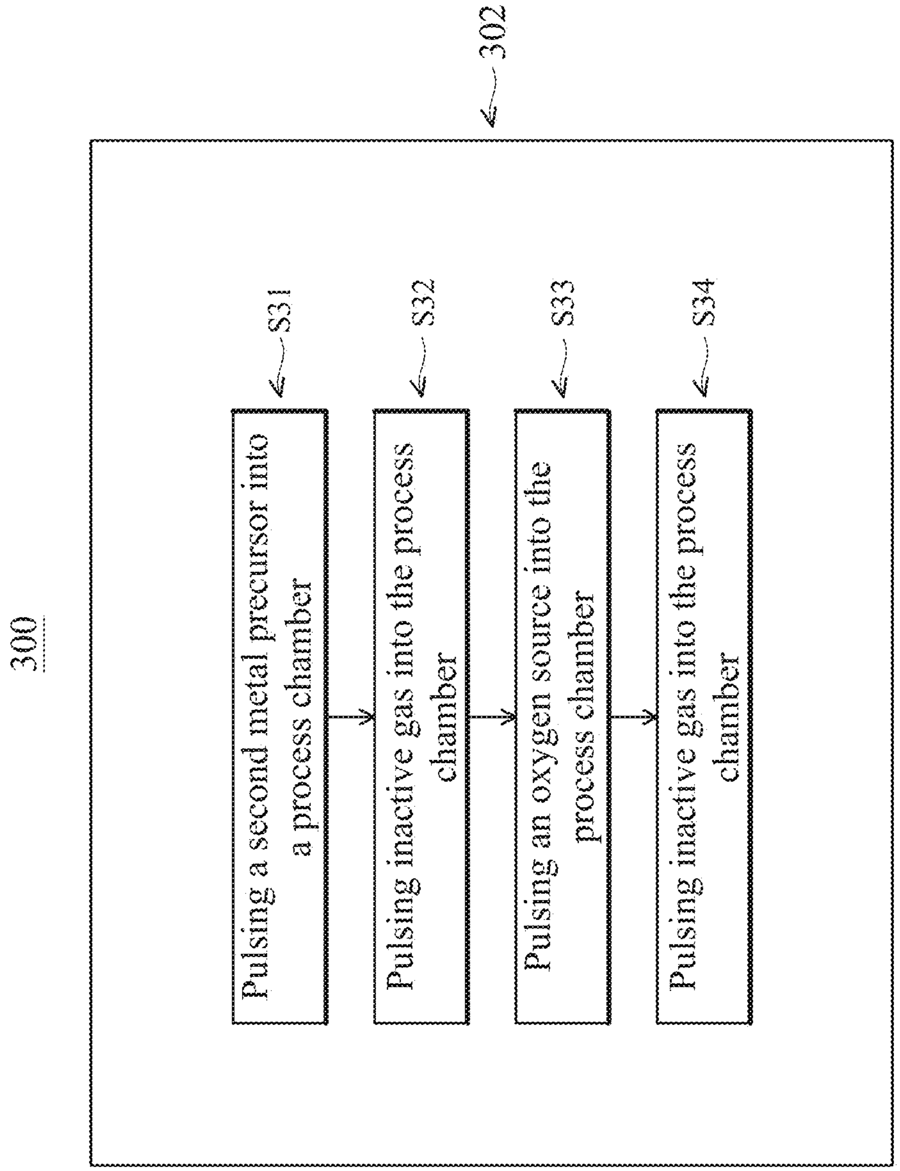

In some embodiments, the second dielectric layer 106 may be formed by ALD. In some embodiments, the second dielectric layer 106 may be other formed by CVD, PECVD, or the like, depending on the manufacturing requirements such as cost or throughput concerns. In some embodiments the second dielectric layer 106 is formed by an ALD process 300 (see FIG. 26). The ALD process 300 may be used to form the second dielectric layer 106 in the same process chamber, without removing the substrate 50 (e.g., the nanostructure-FETs) from the process chamber or interposing any other preparation steps, as the process chamber used to form the first dielectric layer 104 with the ALD process 200. For example, after step S24 is performed, Step S31 is performed, where a second metal precursor is pulsed into the process chamber. In some embodiments, the second metal precursor is adsorbed onto the surface of the first dielectric layer 104 through ligand exchange (e.g., reacts with the terminal hydroxyl groups of the first dielectric layer 104). In some embodiments, the second metal precursor includes HfCl4, Hf(NO3)4, Hf[N(CH3)2]4, Hf[N(C2H5)2]4, Hf[N(CH3)(C2H5)]4, tetrakis (ethylmethylamino)zirconium (TEMAZ), Tris(N,N'-di-i-propylformamidinato) lanthanum (III) (La-FMD), Mg(CpEt)2, Ba(tBu3Cp)2, TiCl4, Pb(Et)4, YCp3, combinations thereof, or the like. For example, in some embodiments where the second metal precursor is HfCl4, HfCl4 reacts with the terminal hydroxyl groups of the first dielectric layer 104 so that hafnium atoms of HfCl4 bonds to oxygen atoms of the terminal hydroxyl groups of the first dielectric layer 104 and forms a monolayer (e.g., HfCl4) deposited over the interfacial layer 100 and byproducts of HCl. In some embodiments, the substrate 50 (e.g., the nanostructure-FETs) is heated to about 200° C. to about 400° C. for facilitating the ligand exchange reaction. Step S31 may be performed for more than about 0.1 seconds for providing sufficient second metal precursor to be adsorbed by self-limiting reactions on the surface of the first dielectric layer 104, e.g., creating a second-metal-precursor saturated surface. Step S31 may be performed for less than 5 seconds to avoid the second metal precursor from being desorbed from the surface of the first dielectric layer 104 after the surface is saturated.

Next, step S32 is performed. An inactive gas is pulsed to the process chamber to purge the process chamber, such as flushing out unreacted remains of second metal precursors and any by-products generated in step S31, in accordance with some embodiments. In some embodiments, step S32 may use the same process or parameters as step S22. In Step S33, an oxygen source is pulsed to the process chamber in accordance with some embodiments. The oxygen source may react to the second metal precursor adsorbed on the first dielectric layer 104, thereby forming the monolayer of the second metal oxide, such as HfO2 in the example discussed above. For example, the remaining ligands of the second metal precursor will be replaced with oxygen atoms or hydroxyl groups. In some embodiments, the oxygen source may include water, hydrogen peroxide, alcohol, oxygen, ozone, or a combination thereof. In some embodiments, in step S33, the substrate 50 is heated to about 200° C. to about 400° C. Step S33 may be performed for about 0.1 seconds to about 10 seconds. Next, S34 is performed, where an inactive gas is pulsed to the process chamber to purge the process chamber, such as flushing out the remaining oxygen source and any by-products generated in step S33, in accordance with some embodiments. In some embodiments, step S34 may use the same process or parameters as step S24. The Steps S31-S34 may constitute a cycle 302 of the ALD process 300, and 6 to 30 cycles may be repeated until the desired thickness of the second dielectric layer is achieved.

Figure 20A:
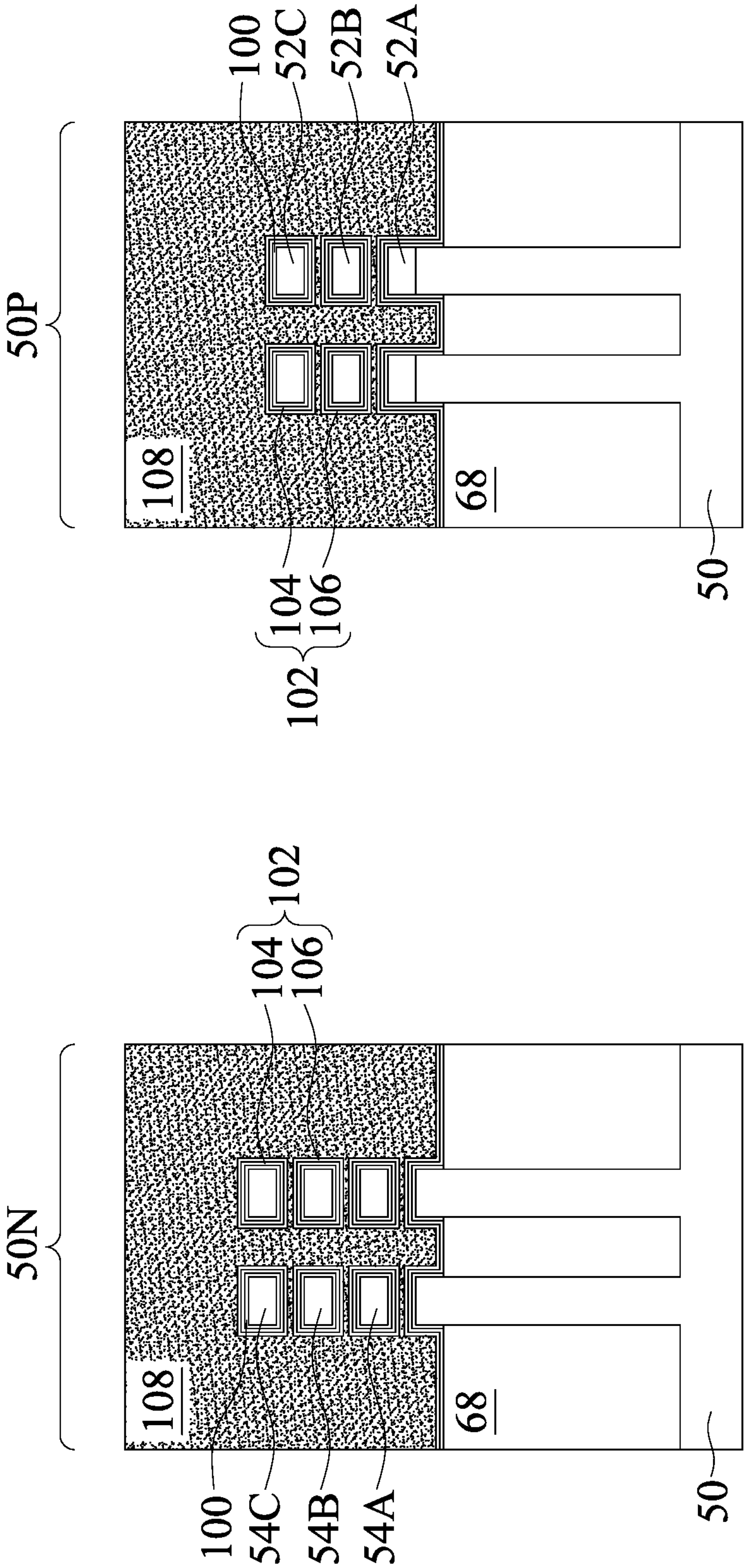
Figure 20B:
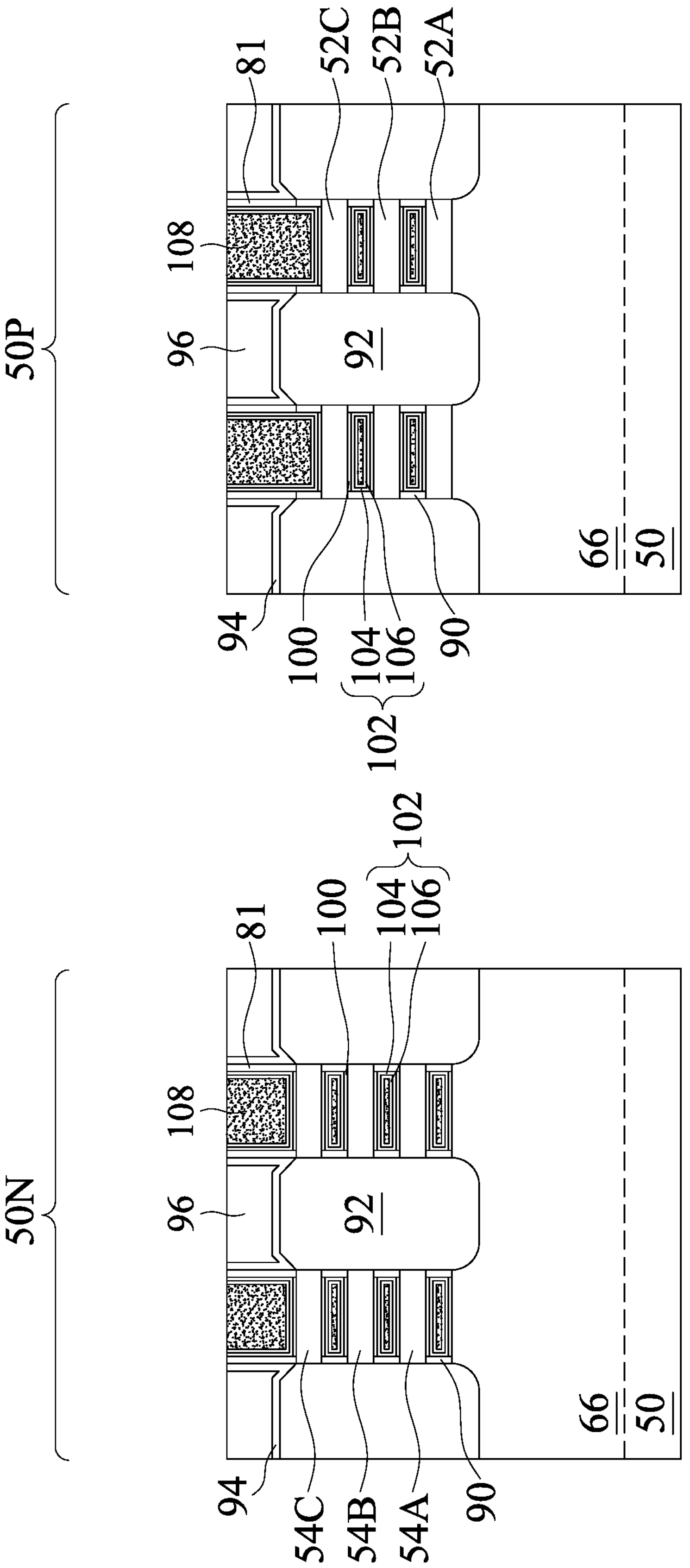

FIGS. 20A-20B illustrates gate electrodes 108 deposited over the gate dielectric structures 102, respectively, in accordance with some embodiments. The gate electrodes 108 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 108 are illustrated in FIGS. 20A and 20B, the gate electrodes 108 may comprise any number of liner layers, any number of work function tuning layers, and a fill material. Any combination of the layers which make up the gate electrodes 108 may be deposited in the n-type region 50N between adjacent ones of the second nanostructures 54 and between the second nanostructure 54A and the substrate 50, and may be deposited in the p-type region 50P between adjacent ones of the first nanostructures 52.

After the filling of the second recesses 98, a planarization process, such as a CMP, may be performed to remove the excess portions of the gate dielectric structures 102 and the gate electrodes 108, which excess portions are over the top surface of the first ILD 96. The remaining portions of material of the gate electrodes 108 and the gate dielectric structures 102 thus form replacement gate structures of the resulting nanostructure-FETs. The gate electrodes 108, the gate dielectric structures 102, and the interfacial layers 100 may be collectively referred to as "gate structures."

Figure 21A:
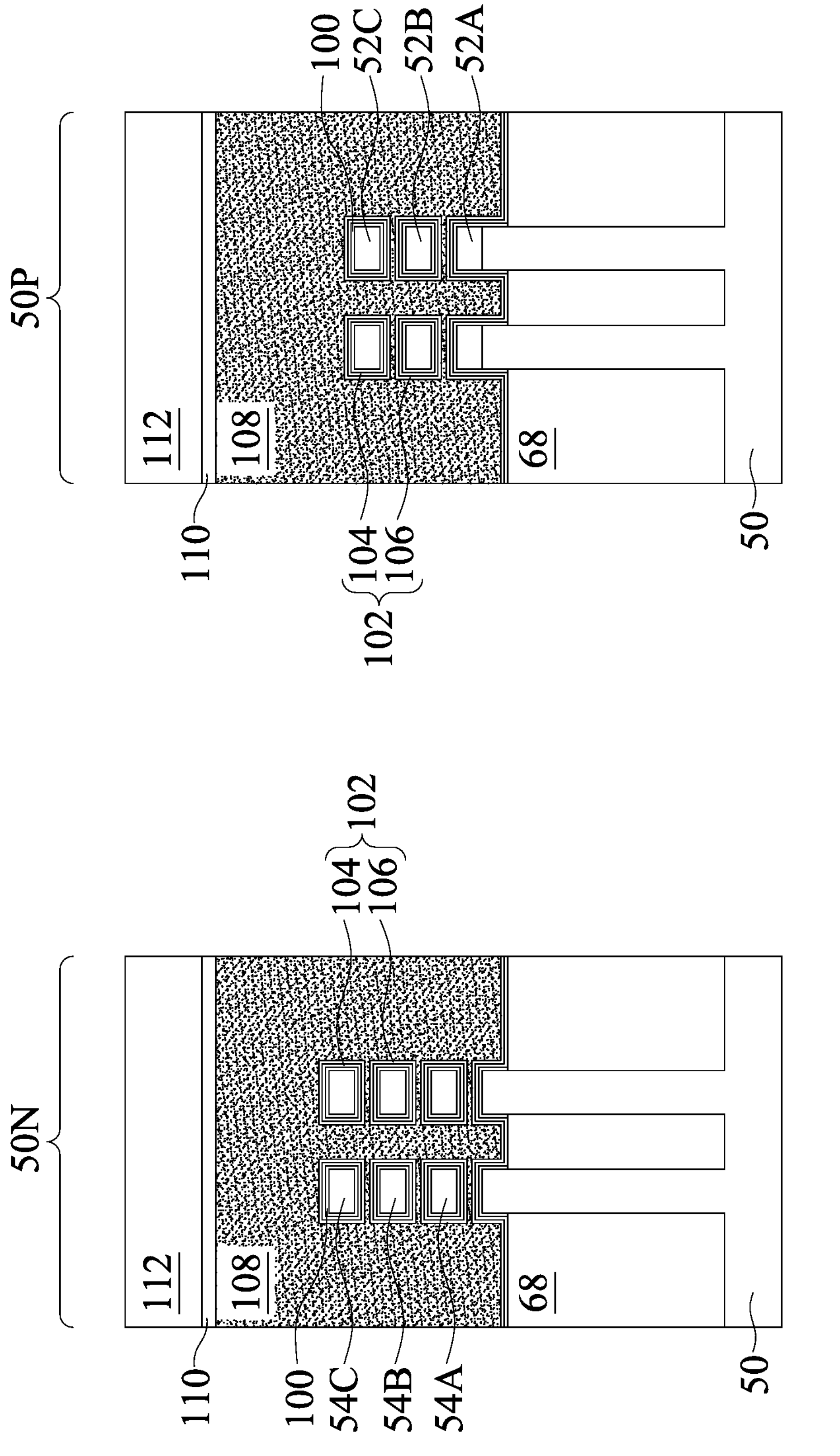
Figure 21B:
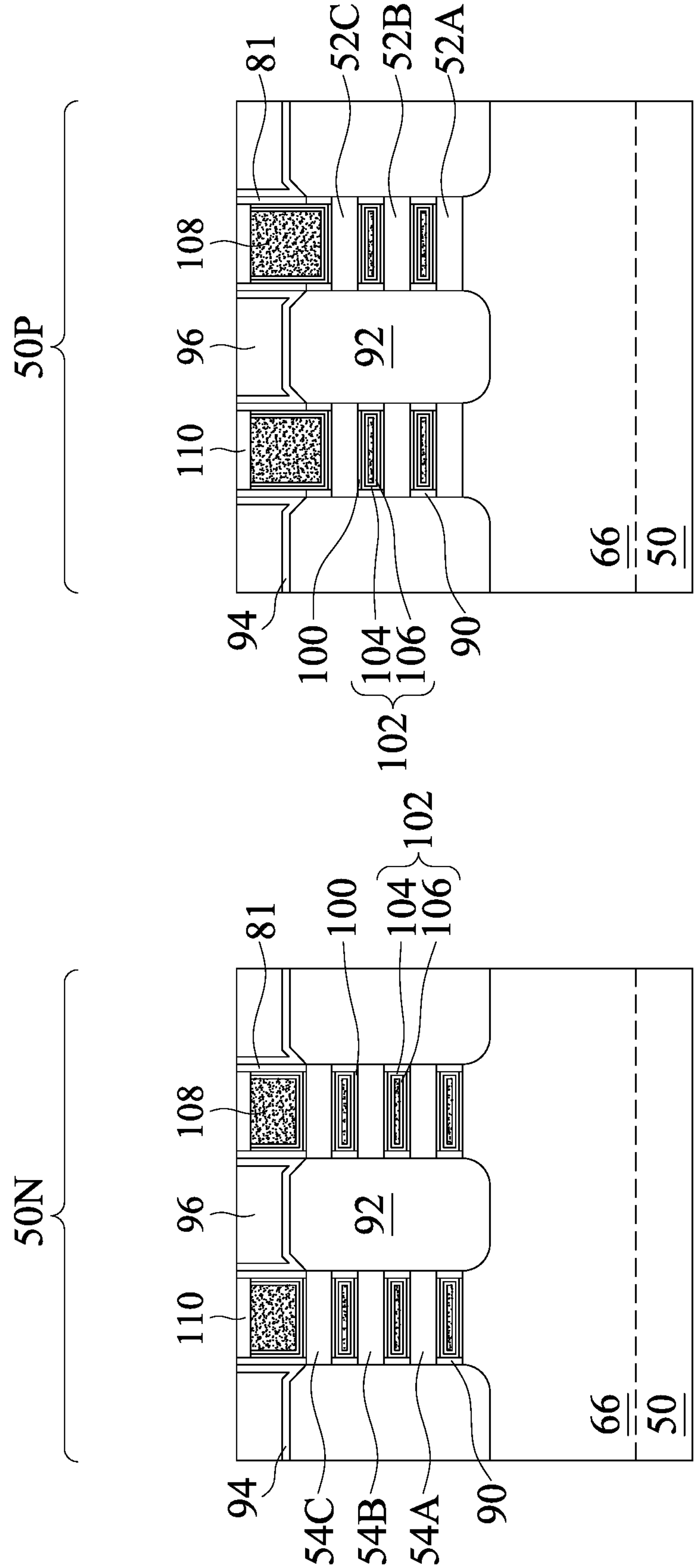
Figure 21C:
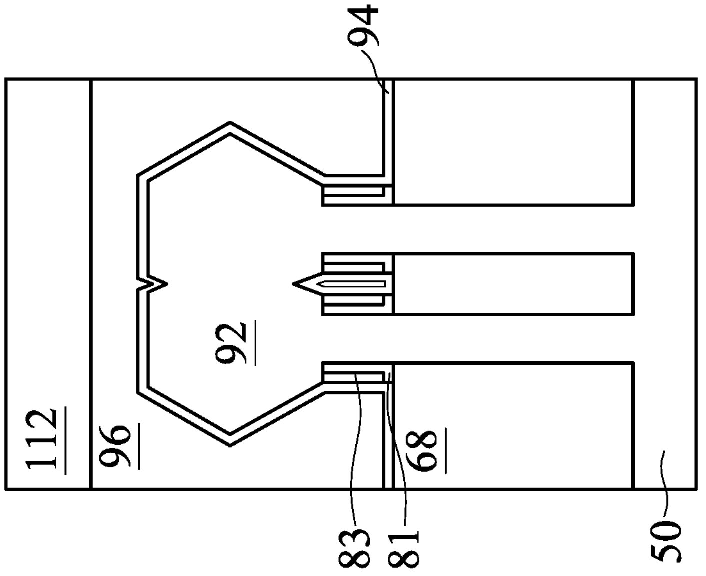

In FIGS. 21A-21C, the gate structure (including the gate dielectric structures 102 and the corresponding overlying gate electrodes 108) is recessed so that a recess is formed directly over the gate structure and between opposing portions of the first spacers 81. A gate mask 110 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as contacts 120, discussed below with respect to FIGS. 23A and 23B) penetrate through the gate mask 110 to contact the top surface of the recessed gate electrodes 108.

As further illustrated by FIGS. 21A-21C, a second ILD 112 is deposited over the first ILD 96 and over the gate mask 110. In some embodiments, the second ILD 112 is a flowable film formed by FCVD. In some embodiments, the second ILD 112 is formed of a dielectric material such as PSG, BSG, BPSG, USG, or the like, and may be deposited by any suitable method, such as CVD, PECVD, or the like.

Figure 22A:
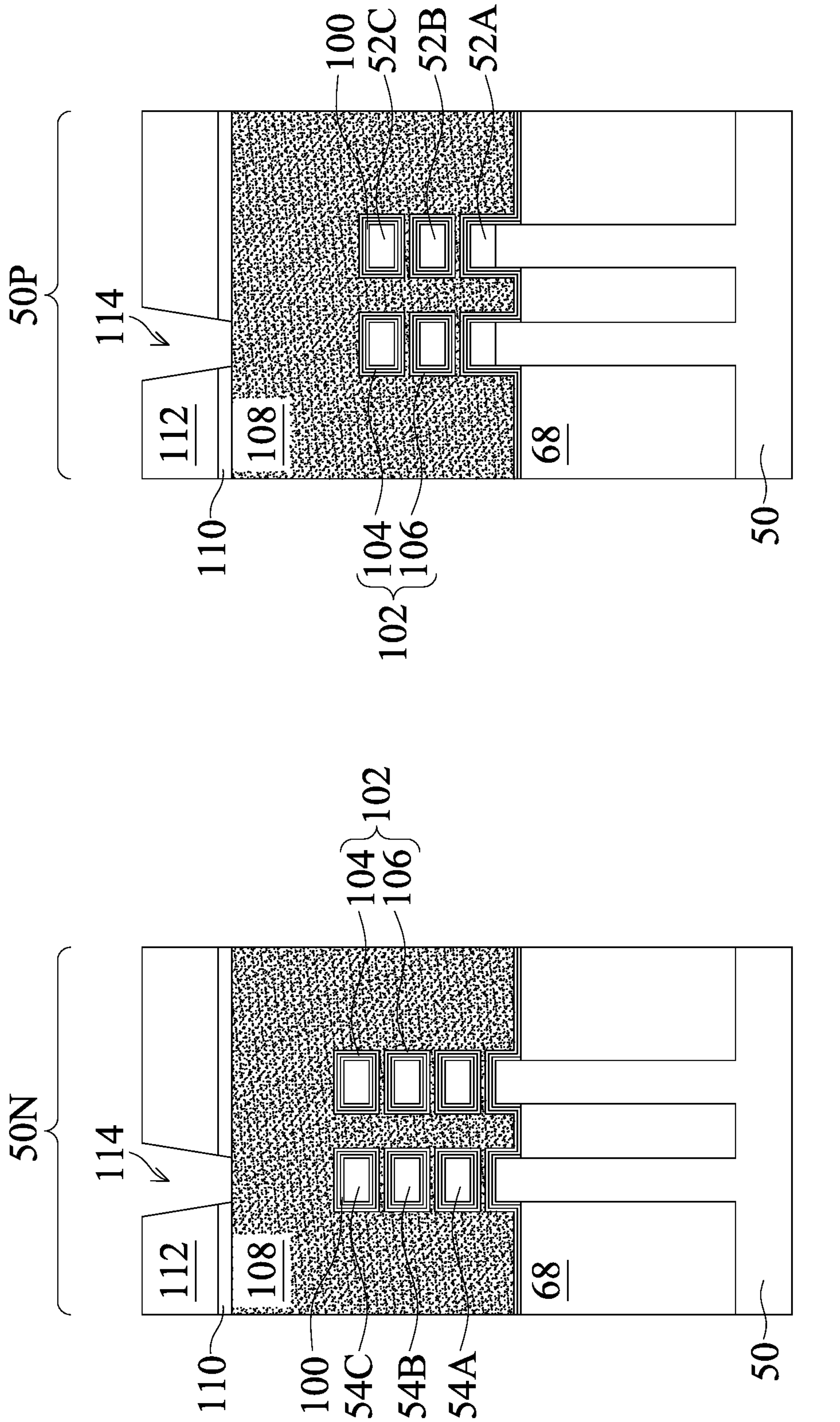
Figure 22B:
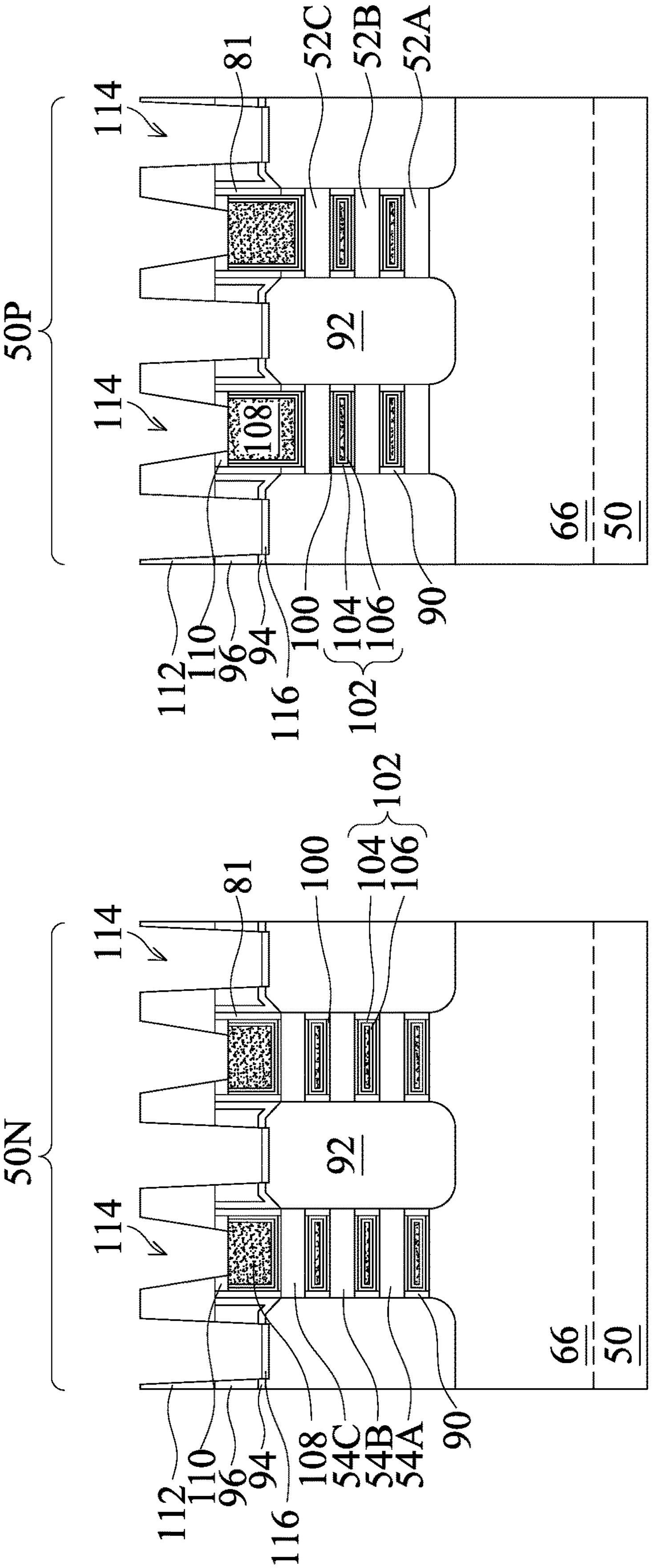
Figure 22C:
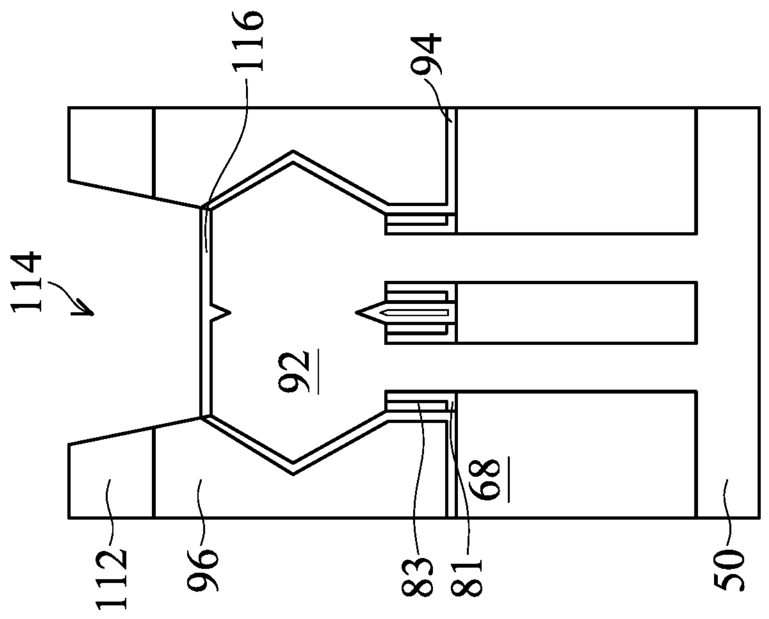

In FIGS. 22A-22C, the second ILD 112, the first ILD 96, the CESL 94, and the gate masks 110 are etched to form third recesses 114 that expose surfaces of the epitaxial source/drain regions 92 and/or the gate structure. The third recesses 114 may be formed by etching using an anisotropic etching process, such as RIE, NBE, or the like. In some embodiments, the third recesses 114 may be etched through the second ILD 112 and the first ILD 96 using a first etching process; may be etched through the gate masks 110 using a second etching process; and may then be etched through the CESL 94 using a third etching process. A mask, such as a photoresist, may be formed and patterned over the second ILD 112 to mask portions of the second ILD 112 from the first etching process and the second etching process. In some embodiments, the etching process may over-etch, and therefore, the third recesses 114 extend into the epitaxial source/drain regions 92 and/or the gate structure, and a bottom of the third recesses 114 may be level with (e.g., at a same level, or having a same distance from the substrate), or lower than (e.g., closer to the substrate) the epitaxial source/drain regions 92 and/or the gate structure. Although FIG. 22B illustrate the third recesses 114 as exposing the epitaxial source/drain regions 92 and the gate structure in a same cross-section, in various embodiments, the epitaxial source/drain regions 92 and the gate structure may be exposed in different cross-sections, thereby reducing the risk of shorting subsequently formed contacts. After the third recesses 114 are formed, silicide regions 116 are formed over the epitaxial source/drain regions 92. In some embodiments, the silicide regions 116 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 116. The un-reacted portions of the deposited metal are then removed, e.g., by an etching process. Although silicide regions 116 are referred to as silicide regions, silicide regions 116 may also be germanide regions, or silicon germanide regions (e.g., regions comprising silicide and germanide). In an embodiment, the silicide region 116 comprises TiSi, and has a thickness in a range between about 2 nm and about 10 nm.

Figure 23A:
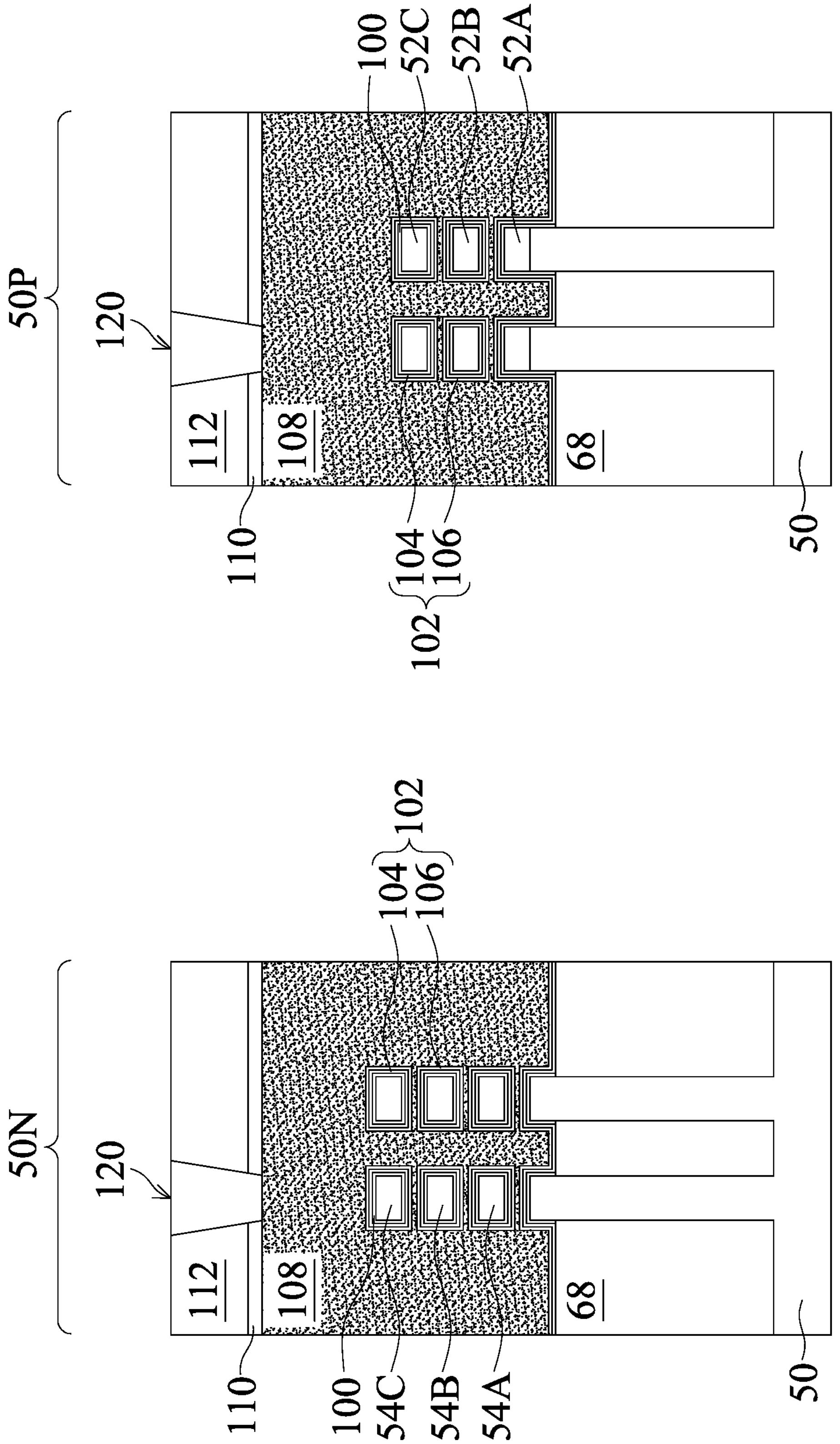
Figure 23B:
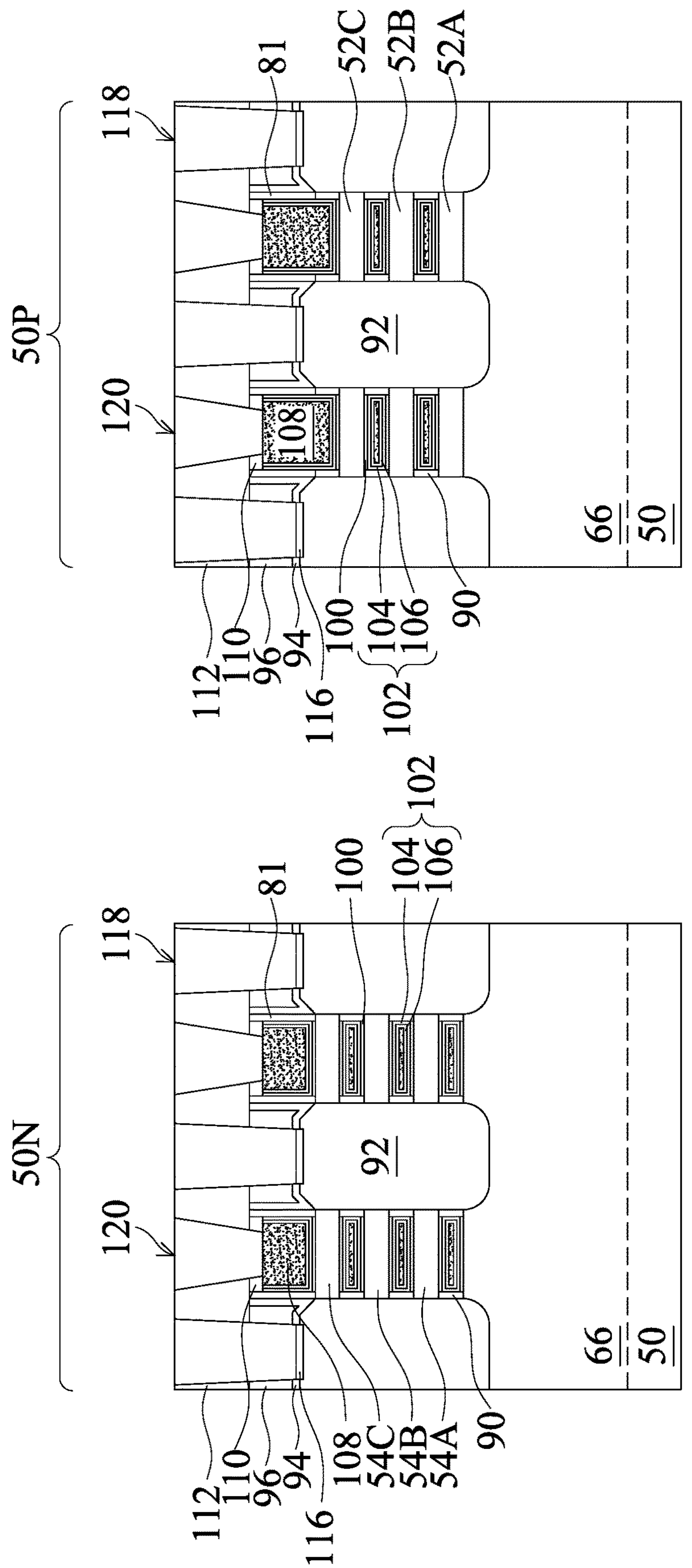
Figure 23C:
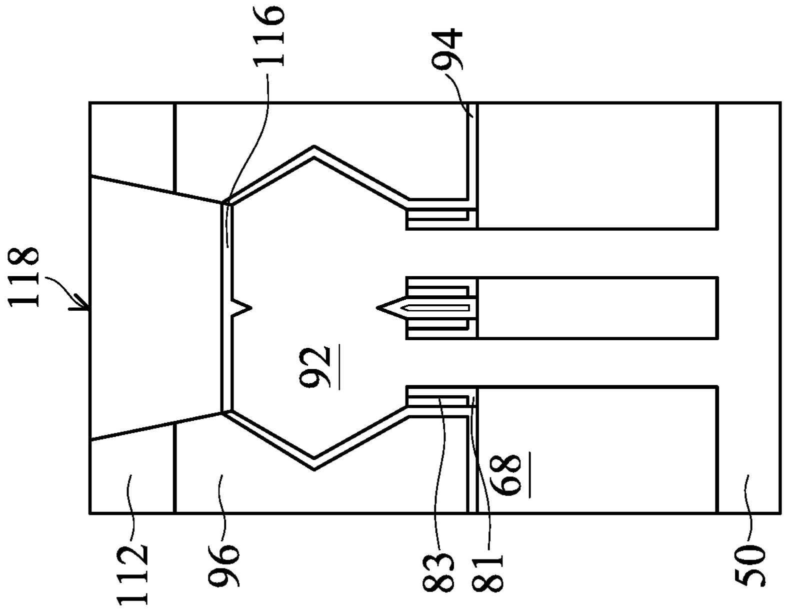

Next, in FIGS. 23A-23C, contacts 118 and 120 (may also be referred to as contact plugs) are formed in the third recesses 114. The contacts 118 and 120 may each comprise one or more layers, such as barrier layers, diffusion layers, and fill materials. For example, in some embodiments, the contacts 118 and 120 each include a barrier layer and a conductive material, and is electrically coupled to the underlying conductive feature (e.g., gate electrodes 108 and/or silicide region 116 in the illustrated embodiment). The contacts 120 are electrically coupled to the gate electrodes 108 and may be referred to as gate contacts, and the contacts 118 are electrically coupled to the silicide regions 116 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 112.

FIGS. 24A-24C illustrate cross-sectional views of a device according to some alternative embodiments. FIG. 24A illustrates reference cross-section A-A' illustrated in FIG. 1. FIG. 24B illustrates reference cross-section B-B' illustrated in FIG. 1. FIG. 24C illustrates reference cross-section C-C' illustrated in FIG. 1. In FIGS. 24A-C, like reference numerals indicate like elements formed by like processes as the structure of FIGS. 23A-C. However, in FIGS. 24A-C, channel regions in the n-type region 50N and the p-type region 50P comprise a same material. For example, the second nanostructures 54, which comprise silicon, provide channel regions for p-type NSFETs in the p-type region 50P and for n-type NSFETs in the n-type region 50N. The structure of FIGS. 24A-C may be formed, for example, by removing the first nanostructures 52 from both the p-type region 50P and the n-type region 50N simultaneously; depositing the gate dielectric structures 102 and the gate electrodes 108 (e.g., gate electrode suitable for a p-type NSFET) around the second nanostructures 54 in the p-type region 50P; and depositing the gate dielectric structures 102 and the gate electrodes 108 (e.g., a gate electrode suitable for a n-type NSFET) around the second nanostructures 54 in the n-type region 50N. In such embodiments, materials of the epitaxial source/drain regions 92 may be different in the n-type region 50N compared to the p-type region 50P as explained above.

Figure 27A:
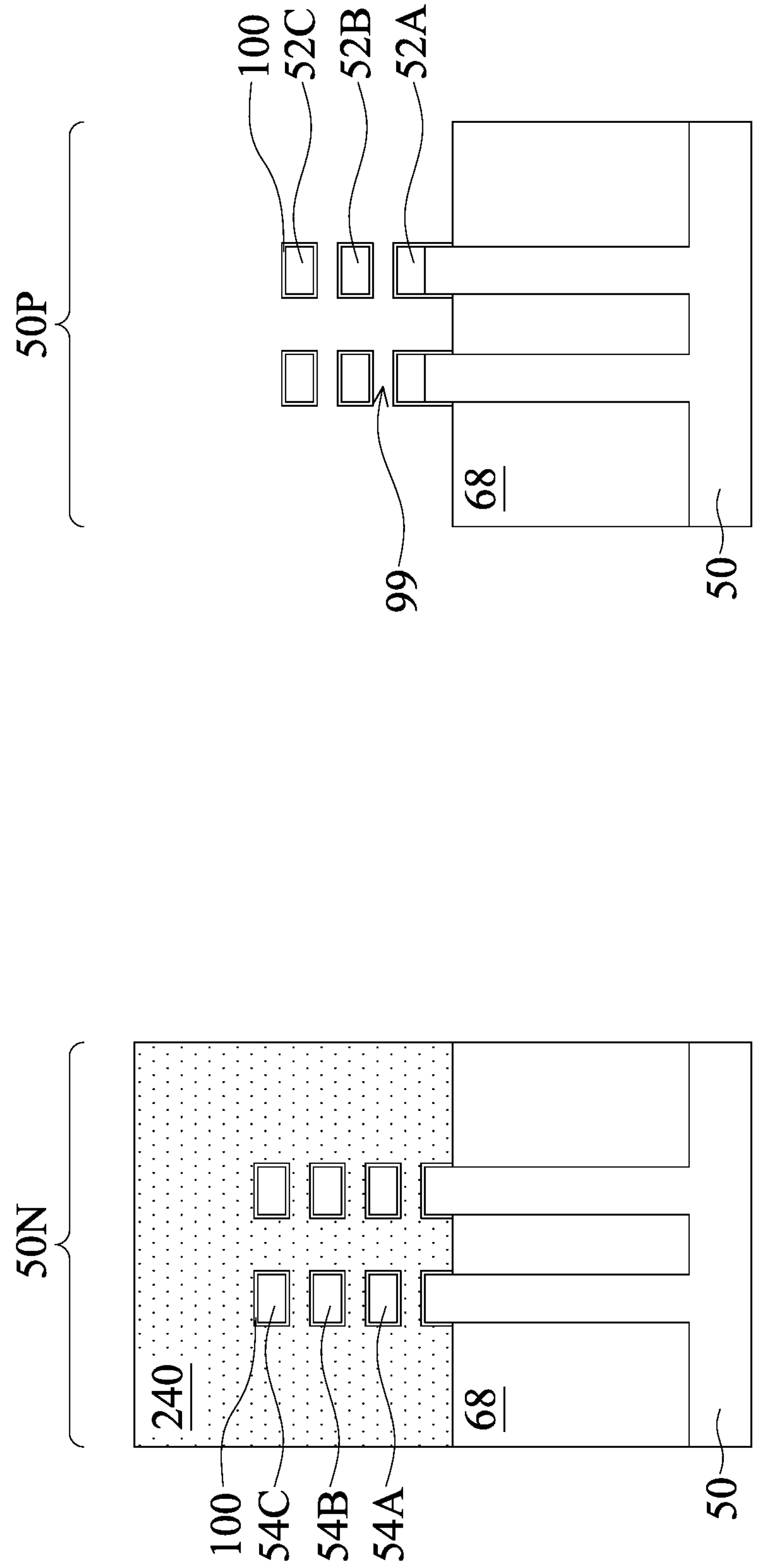
FIGS. 27A, 27B, 28A, 28B, 29A, and 29B are cross-sectional views of intermediate stages in the manufacturing of nanostructure-FETs, in accordance with some embodiments.
Figure 27B:
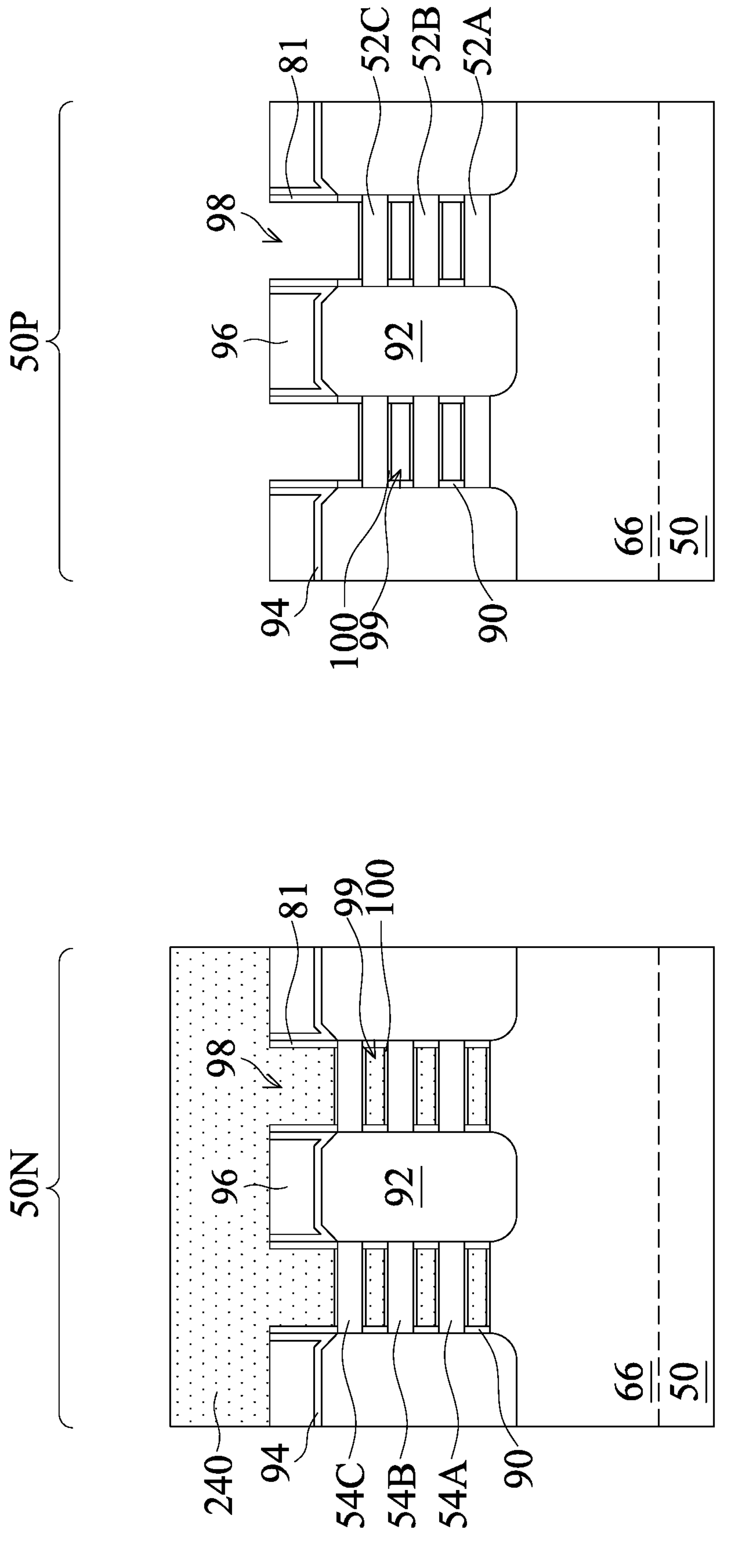
Figure 28A:
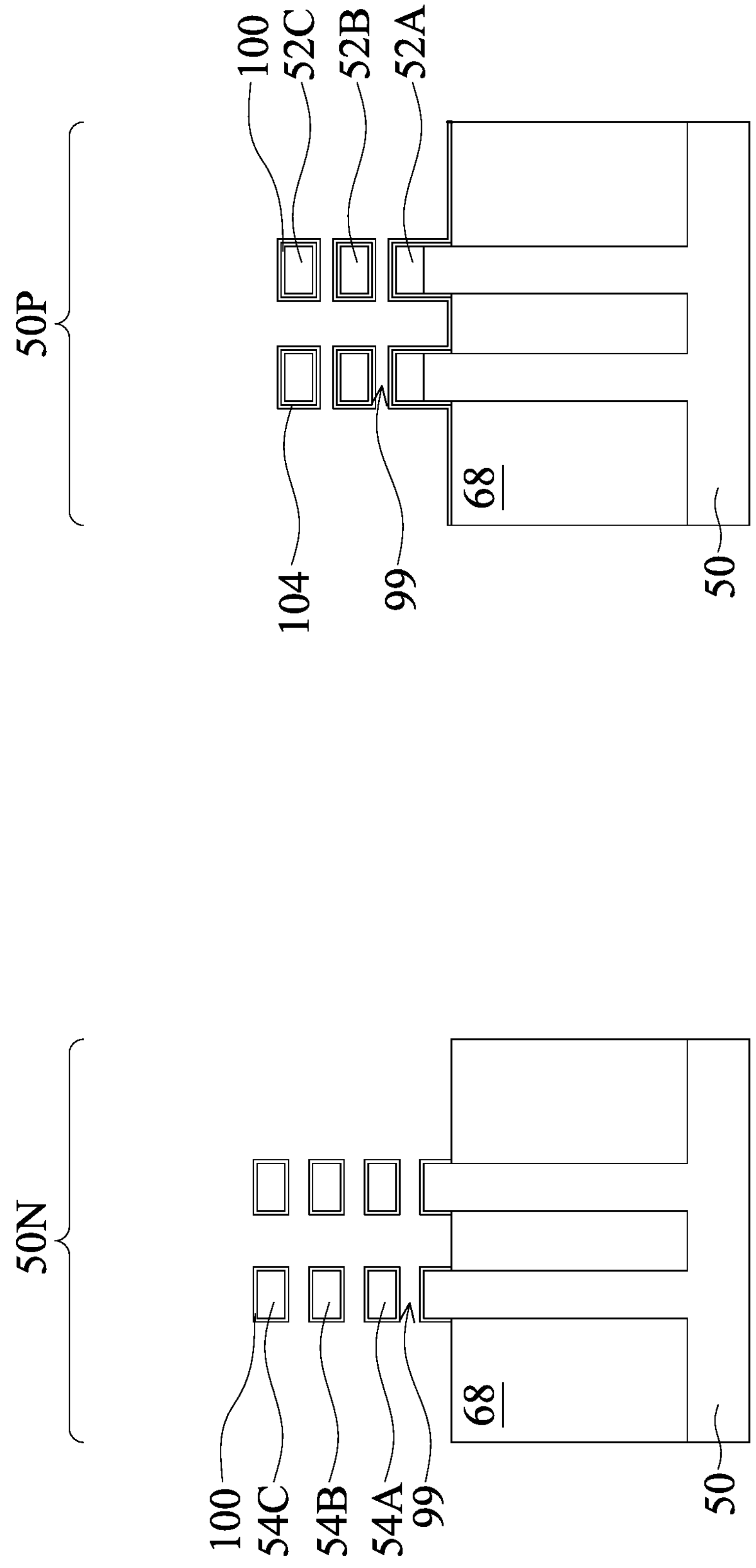
Figure 28B:
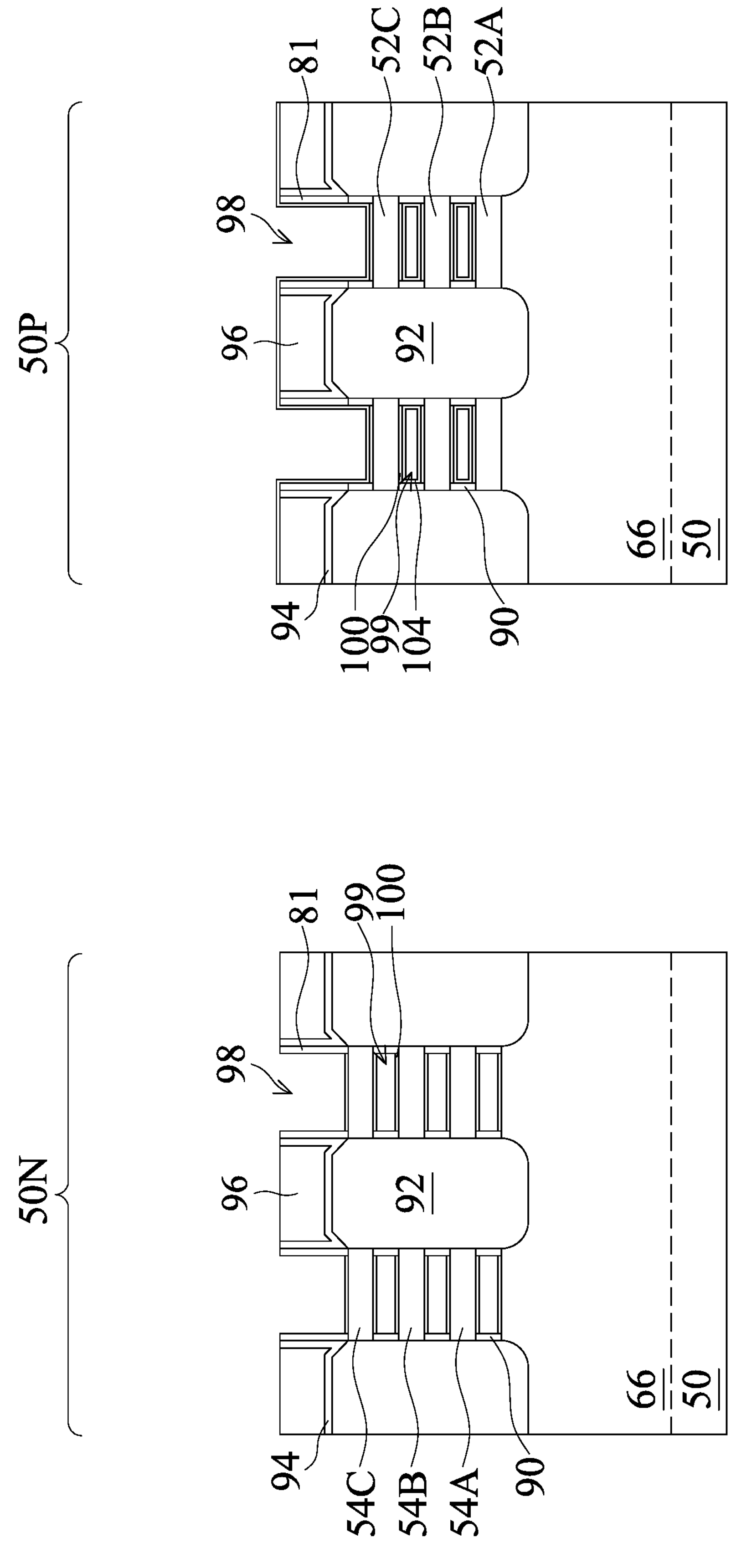
Figure 29A:
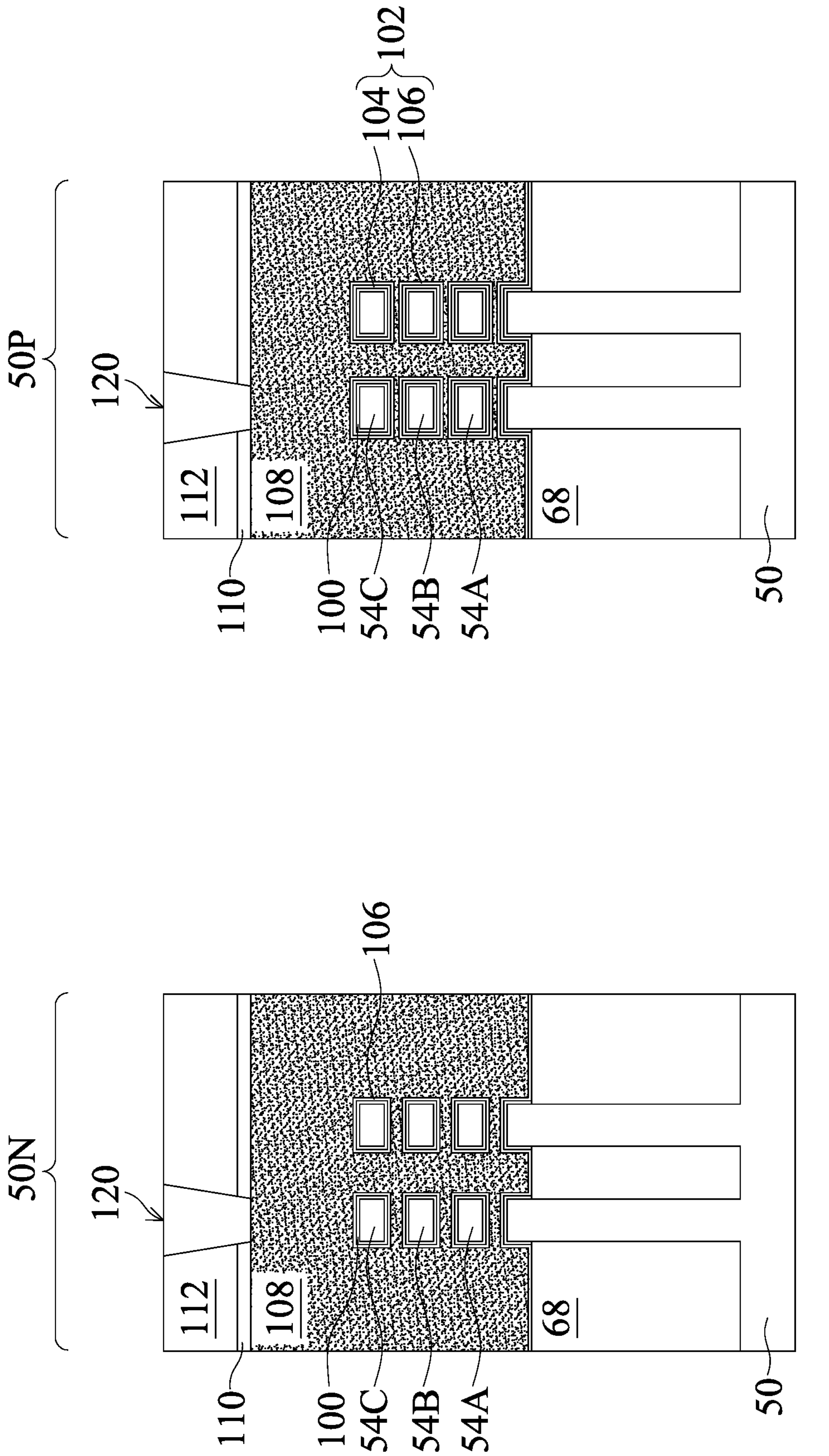
Figure 29B:
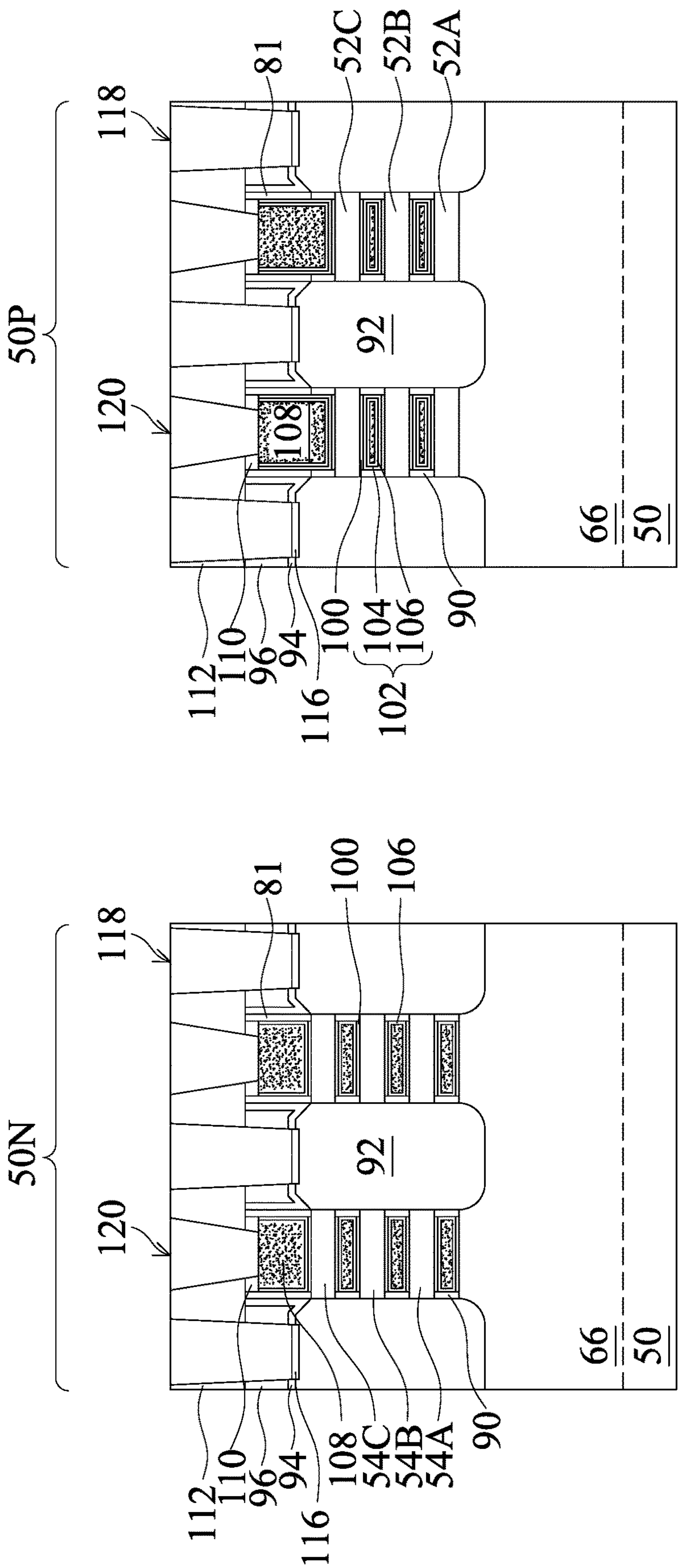

The embodiments discussed above forms the first dielectric layer 104 in both the n-type region 50N and the p-type region 50P for illustrative purposes. In some embodiments, the first dielectric layer 104 may only be formed in one of the n-type region 50N and the p-type region 50P. For example, FIGS. 27A-29B illustrate cross-sectional views of alternative embodiments of nanostructure-FET at intermediate manufacturing stages, where the first dielectric layer 104 is formed in the p-type region 50P only. In such embodiments, the gate dielectric structure 102 in the p-type region 50P comprises the first dielectric layer 104 and the second dielectric layer 106, and the second gate structure in the n-type region 50N is formed of the second dielectric layer 106. In these embodiments, the same features are designated the same numeral references as in the previous embodiments as illustrated in FIGS. 1-26. FIGS. 27A, 28A, and 29A illustrate reference cross-section A-A' illustrated in FIG. 1. FIGS. 27B, 28B, and 29B illustrate reference cross-section B-B' illustrated in FIG. 1.

In some embodiments, the nanostructure-FETs as illustrated in FIGS. 17A and 17B are provided, and as illustrated in FIGS. 27A and 27B, a mask 240 is formed to cover the n-type region 50N and expose the p-type region 50P. For example, a photoresist may be formed over the interfacial layer 100 in the n-type region 50N and the p-type region 50P and patterned to form the mask 240. The photoresist may be patterned using one or more acceptable photolithography techniques.

In FIGS. 28A and 28B, the first dielectric layer 104 is deposited over the interfacial layer 100 only in the p-type region 50N since the n-type region 50P is covered by the mask 240 in accordance with some embodiments. After the first dielectric layer 104 is formed, the mask 240 may be removed by any suitable process, such as ashing or stripping. Next, processes similar to the processes as illustrated in FIGS. 19A-24C are performed, and resulting nanostructure-FETs illustrated in FIGS. 29A and 29B are formed. The gate dielectric structure 102 comprising the first dielectric layer 104 and the second dielectric layer 106 may be formed in the p-type region 50P. A gate dielectric structure formed of the second dielectric layer 106 may be formed in the n-type region 50N. The second dielectric layer 106 in the n-type region 50N may be in direct contact with the interfacial layer 100.

According to various embodiments of the present disclosure, a semiconductor device comprising a multi-layer gate dielectric structure and methods for forming it are provided. The gate dielectric layer structure may include a first dielectric layer that may create dipoles in the gate dielectric structure to tune the flat band voltage of the semiconductor device. The gate dielectric layer structure may also include a second dielectric layer disposed over the first dielectric layer, where the second dielectric layer may be a relatively thick high-k material. In some embodiments, the second dielectric layer has a thickness that is at least three times greater than the thickness of the first dielectric layer. As a result, the high-k characteristics of the gate dielectric structure may be similar to the high-k characteristics of the second dielectric layer, and the CET of the gate dielectric structure is not significantly affected by the first dielectric layer. Thus, a gate dielectric structure that may allow the tuning of the threshold voltage of the nanostructure-FETs while maintaining desired high-k characteristics is provided.

In an embodiment, a semiconductor device includes an interfacial layer over a channel region; a gate dielectric structure including: a first layer of an oxide of a first metal disposed over the interfacial layer, wherein the first layer has a first thickness; and a second layer of an oxide or silicate of a second metal disposed over the first layer, wherein the second layer has a second thickness that is at least three times greater than the first thickness, wherein an oxygen areal density of the oxide of the first metal is greater than an oxygen areal density of the oxide of the second metal; and a gate electrode disposed over the gate dielectric structure. In an embodiment, the interfacial layer includes an oxide, and at least a portion of the first metal of the first layer is bonded to the interfacial layer. In an embodiment, at least a portion of the second metal is bonded to the first layer. In an embodiment, the first layer has a thickness less than 4 angstroms. In an embodiment, the first metal is selected from aluminum, zinc, gallium, or hafnium. In an embodiment, the second metal includes hafnium, aluminum, zirconium, lanthanum, manganese, barium, titanium, lead, yttrium, or combinations thereof. In an embodiment, the gate dielectric structure has a capacitance equivalent thickness of 0.28 nm to 0.53 nm. In an embodiment, the interfacial layer has a thickness at least five times a thickness of the first layer.

In an embodiment, a semiconductor device, includes an interfacial layer disposed over a channel region, wherein the interfacial layer includes an oxide of a semiconductor; a gate dielectric structure disposed over the interfacial layer, wherein the gate dielectric structure has a first capacitance equivalent thickness (CET) and includes: a first layer including one to three monolayers, wherein the one to three monolayers include an oxide of a first metal, wherein the first metal is selected from aluminum, zinc, gallium, or hafnium; and a second layer of an oxide or silicate of a second metal disposed over the first layer, wherein the second layer has a second CET, wherein a difference between the first CET and the second CET is in a range from 0.04 nm to 0.29 nm; and a gate electrode disposed over the gate dielectric structure. In an embodiment, the oxide of the first metal has an oxygen areal density greater than an oxygen areal density of the oxide of the second metal. In an embodiment, the second metal includes hafnium, aluminum, zirconium, lanthanum, manganese, barium, titanium, lead, yttrium, or combinations thereof. In an embodiment, the interfacial layer has a thickness at least five times greater than a thickness of the first layer.

In an embodiment, a method of forming a semiconductor device includes: forming a channel region over a substrate; forming a first gate dielectric layer over the channel region by a first atomic layer deposition, wherein the first gate dielectric layer includes an oxide of a first metal; forming a second gate dielectric layer over the first gate dielectric layer, wherein the second gate dielectric layer includes an oxide or silicate of a second metal, wherein an oxygen areal density of the first gate dielectric layer is greater than an oxygen areal density of the second gate dielectric layer, wherein the second gate dielectric layer has a thickness greater than a thickness of the first gate dielectric layer; and forming a gate electrode over the second gate dielectric layer. In an embodiment, the first atomic layer deposition includes a one to three pulses of a metal precursor, wherein a duration of each pulse of the metal precursor is in a range between 0.1 seconds and 5 seconds. In an embodiment, the first atomic layer deposition includes only one pulse of the metal precursor. In an embodiment, the metal precursor includes trimethylaluminum, aluminum trichloride, dimethylzinc, diethylzinc, trimethylgallium, triethylgallium, hafnium tetrachloride, Hf(NO3)4, Hf[N(CH3)2]4, Hf[N(C2H5)2]4, Hf[N(CH3)(C2H5)]4, or a combination thereof. In an embodiment, the first atomic layer deposition includes introducing the metal precursor with a carrier gas, wherein the carrier gas includes N2, Ar, He, or a combination thereof, wherein a flow rate of the carrier gas is in a range from 100 sccm to 300 sccm. In an embodiment, the second gate dielectric layer is formed by a second atomic layer deposition. In an embodiment, the first atomic layer deposition is performed in a process chamber, wherein the second atomic layer deposition is performed in the process chamber after the first atomic layer deposition without removing the substrate from the process chamber during a period between the first atomic layer deposition and the second atomic layer deposition. In an embodiment, the method further includes forming an interfacial layer over the channel region, wherein the first gate dielectric layer is formed over the interfacial layer, wherein the interfacial layer includes terminal hydroxyl groups.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:

forming a channel region over a substrate;

forming an interfacial layer around the channel region, wherein the interfacial layer comprises terminal hydroxyl groups;

forming a first gate dielectric layer around the interfacial layer by a first atomic layer deposition, wherein the first gate dielectric layer comprises an oxide of a first metal;

forming a second gate dielectric layer around the first gate dielectric layer, wherein the second gate dielectric layer comprises an oxide or silicate of a second metal, wherein an oxygen areal density of the first gate dielectric layer is greater than an oxygen areal density of the second gate dielectric layer, wherein the second gate dielectric layer has a thickness greater than a thickness of the first gate dielectric layer; and forming a gate electrode around the first gate dielectric layer and the second gate dielectric layer while the first gate dielectric layer and the second gate dielectric layer remain present, and wherein the first gate dielectric layer is in direct contact with the interfacial layer when the gate electrode is formed.

2. The method of claim 1, wherein the first atomic layer deposition comprises one to three pulses of a metal precursor, wherein a duration of each pulse of the metal precursor is in a range between 0.1 seconds and 5 seconds.

3. The method of claim 2, wherein the first atomic layer deposition comprises only one pulse of the metal precursor.

4. The method of claim 2, wherein the metal precursor comprises trimethylaluminum, aluminum trichloride, dimethylzinc, diethylzinc, trimethylgallium, triethylgallium, hafnium tetrachloride, $Hf(NO_3)_4$, $Hf[N(CH_3)_2]_4$, $Hf[N(C_2H_5)_2]_4$, $Hf[N(CH_3)(C_2H_5)]_4$, or a combination thereof.

5. The method of claim 2, wherein the first atomic layer deposition comprises introducing the metal precursor with a carrier gas, wherein the carrier gas comprises $N_2$, Ar, He, or a combination thereof, wherein a flow rate of the carrier gas is in a range from 100 sccm to 300 sccm.

6. The method of claim 1, wherein the second gate dielectric layer is formed by a second atomic layer deposition.

7. The method of claim 6, wherein the first atomic layer deposition is performed in a process chamber, wherein the second atomic layer deposition is performed in the process chamber after the first atomic layer deposition without removing the substrate from the process chamber during a period between the first atomic layer deposition and the second atomic layer deposition.

8. The method of claim 1, wherein the interfacial layer is a silicon oxide layer, the first gate dielectric layer is an aluminum oxide layer, and the second gate dielectric layer is a hafnium oxide layer.

9. A method of forming a semiconductor device, the method comprising:

forming a channel region over a substrate;

forming an interfacial layer around the channel region;

forming a first gate dielectric layer around the interfacial layer by a first deposition process, wherein the first gate dielectric layer comprises a compound comprising a first metal;

forming a second gate dielectric layer around the first gate dielectric layer, wherein the second gate dielectric layer comprises a compound of a second metal different than the first metal, wherein the second gate dielectric layer has a thickness greater than a thickness of the first gate dielectric layer, wherein an oxygen areal density of the first gate dielectric layer is greater than an oxygen areal density of the second gate dielectric layer;

forming a gate electrode around the second gate dielectric layer, wherein there is direct contact between the gate electrode and the second gate dielectric layer after forming the gate electrode; and forming a source/drain contact to a source/drain region, the source/drain region being adjacent to the channel region, forming the source/drain contact comprising a reactive ion etch.

10. The method of claim 9, wherein the first gate dielectric layer comprises an oxide of the first metal.

11. The method of claim 9, wherein the second gate dielectric layer comprises an oxide or a silicate of the second metal.

12. The method of claim 9, wherein forming the first gate dielectric layer comprises a first atomic layer deposition process.

13. The method of claim 12, wherein the first atomic layer deposition process comprises one or more pulses of a metal precursor, wherein the metal precursor comprises trimethylaluminum, aluminum trichloride, dimethylzinc, diethylzinc, trimethylgallium, triethylgallium, hafnium tetrachloride, $Hf(NO_3)_4$, $Hf[N(CH_3)_2]_4$, $Hf[N(C_2H_5)_2]_4$, $Hf[N(CH_3)(C_2H_5)]_4$, or a combination thereof.

14. The method of claim 9, wherein forming the second gate dielectric layer comprises a second ALD process.

15. The method of claim 9, wherein the first gate dielectric layer is one to three mono-layers of a metal oxide.

16. A method of forming a semiconductor device, the method comprising:

forming a channel region over a substrate;

forming an interfacial layer around the channel region;

forming a gate dielectric layer around the interfacial layer, wherein forming the gate dielectric layer comprises:

performing a first atomic layer deposition process to form a first dielectric layer, wherein the first dielectric layer comprises an oxide of a first metal; and performing a second atomic layer deposition process to form a second dielectric layer, wherein the second dielectric layer comprises a silicate of a second metal, wherein an oxygen areal density of the first dielectric layer is greater than an oxygen areal density of the second dielectric layer, wherein the second dielectric layer has a thickness greater than a thickness of the first dielectric layer; and immediately after performing the second atomic layer deposition process, forming a gate electrode over the second dielectric layer.

17. The method of claim 16, wherein the first metal is different than the second metal.

18. The method of claim 16, wherein the first metal is selected from aluminum, zinc, gallium, or hafnium.

19. The method of claim 16, wherein the second metal comprises hafnium, aluminum, zirconium, lanthanum, manganese, barium, titanium, lead, yttrium, or combinations thereof.

20. The method of claim 16, wherein a difference in a first capacitance equivalent thickness (CET) of the second dielectric layer and a second CET of a combined layer of the first dielectric layer and the second dielectric layer is in a range from about 0.04 nm to about 0.29 nm.

* * * * *